US012648197B2

(12) United States Patent
Umeki

(10) Patent No.: US 12,648,197 B2
(45) Date of Patent: Jun. 2, 2026

(54) SEMICONDUCTOR DEVICE

(71) Applicant: ROHM CO., LTD., Kyoto (JP)

(72) Inventor: Shinya Umeki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 620 days.

(21) Appl. No.: 17/924,358

(22) PCT Filed: Jun. 4, 2021

(86) PCT No.: PCT/JP2021/021433
§ 371 (c)(1),
(2) Date: Nov. 10, 2022

(87) PCT Pub. No.: WO2021/261222
PCT Pub. Date: Dec. 30, 2021

(65) Prior Publication Data
US 2023/0187498 A1 Jun. 15, 2023

(30) Foreign Application Priority Data

Jun. 26, 2020 (JP) ................................. 2020-110721

(51) Int. Cl.
*H10D 62/10* (2025.01)
*H10D 8/50* (2025.01)
*H10D 30/66* (2025.01)
*H10D 62/17* (2025.01)

(52) U.S. Cl.
CPC ............. *H10D 62/127* (2025.01); *H10D 8/50* (2025.01); *H10D 30/668* (2025.01); *H10D 62/393* (2025.01)

(58) Field of Classification Search
None
See application file for complete search history.

(56) References Cited

U.S. PATENT DOCUMENTS 5,969,400 A * 10/1999 Shinohe ............... H10D 84/617
257/493
2003/0067033 A1 4/2003 Kinoshita et al.
(Continued)

FOREIGN PATENT DOCUMENTS

DE 11 2018 002 359 T5 1/2020
JP H08-293618 A 11/1996
(Continued)

OTHER PUBLICATIONS

German Office Action issued Jan. 19, 2023, in corresponding German Patent Application 11 2021 002 247.4, 12pp.
(Continued)

*Primary Examiner* — Cory W Eskridge
(74) *Attorney, Agent, or Firm* — XSENSUS LLP

(57) ABSTRACT

A semiconductor device includes a first conductive type semiconductor layer which has a principal surface, a second conductive type well region which demarcates an active region and an outer region on the principal surface and is formed on a surface layer portion of the principal surface and includes a high concentration portion high in impurity concentration on the active region side and includes a low concentration portion lower in impurity concentration than the high concentration portion on the outer region side, and a second conductive type impurity region of the active region which is formed on a surface layer portion of the principal surface.

17 Claims, 17 Drawing Sheets

(56) References Cited

U.S. PATENT DOCUMENTS

| | | | |
|---|---|---|---|
| 2006/0124997 A1* | 6/2006 | Yamauchi | H10D 30/0297 |
| | | | 257/E29.066 |
| 2013/0015493 A1* | 1/2013 | Senoo | H10D 30/668 |
| | | | 257/E29.198 |
| 2013/0153954 A1* | 6/2013 | Takahashi | H10D 62/127 |
| | | | 257/E29.197 |
| 2015/0187868 A1* | 7/2015 | Park | H10D 62/109 |
| | | | 257/493 |
| 2017/0278982 A1* | 9/2017 | Umeki | H10D 8/411 |
| 2017/0288026 A1* | 10/2017 | Hikasa | H01L 21/32 |
| 2020/0091282 A1* | 3/2020 | Murasaki | H10D 30/60 |

FOREIGN PATENT DOCUMENTS

| | | |
|---|---|---|
| JP | 2003-101039 A | 4/2003 |
| JP | 2003-158258 A | 5/2003 |
| JP | 2009021519 A | 1/2009 |
| JP | 2013-021100 A | 1/2013 |
| WO | 2014054319 A1 | 4/2014 |
| WO | 2018/207712 A1 | 11/2018 |

OTHER PUBLICATIONS

International Search Report and Written Opinion mailed on Aug. 24, 2021, received for PCT Application PCT/JP2021/021433, filed on Jun. 4, 2021, 15 pages including English Translation.
Notice of Reasons for Refusal dated Feb. 13, 2025 in corresponding Japanese patent application No. 2022-531675 (16 pages; with English machine translation).
Notice of Reasons for Refusal dated Jun. 17, 2025 in corresponding Japanese patent applications No. 2022-531675 (8 pages; English machine translation).

* cited by examiner

SEMICONDUCTOR DEVICE

CROSS-REFERENCE TO RELATED APPLICATIONS

This application is based on PCT filing PCT/JP2021/021433, filed on Jun. 4, 2021, which claims priority to Japanese Patent Application No. 2020-110721, filed on Jun. 26, 2020 in the Japan Patent Office, and the entire disclosures of each of which are incorporated herein by reference.

TECHNICAL FIELD

The present disclosure relates to a semiconductor device.

BACKGROUND ART

Patent Literature 1 discloses a semiconductor device which includes an n type drift layer having an active region and a p type well layer formed in a termination region outside the active region.

CITATION LIST

Patent Literature

Patent Literature 1: Japanese Patent Application Publication No. 2003-158258

SUMMARY OF INVENTION

Technical Problem

One preferred embodiment of the present disclosure provides a semiconductor device capable of suppressing a decrease in withstand voltage.

Solution to Problem

The semiconductor device according to one preferred embodiment of the present disclosure provides a semiconductor device including a first conductive type semiconductor layer which has a principal surface, a second conductive type well region which demarcates an active region and an outer region on the principal surface, is formed on a surface layer portion of the principal surface and includes, on the active region side, a first concentration portion high in impurity concentration and includes, on the outer region side, a second concentration portion lower in impurity concentration than the first concentration portion, and a second conductive type impurity region of the active region which is formed on the surface layer portion of the principal surface.

BRIEF DESCRIPTION OF DRAWINGS

FIG. 10 is a sectional view of an active region of a semiconductor device according to a fourth preferred embodiment of the present disclosure.

DESCRIPTION OF EMBODIMENTS

Hereinafter, a description will be given in detail of preferred embodiments of the present disclosure by accompanying drawings.

Figure 1:
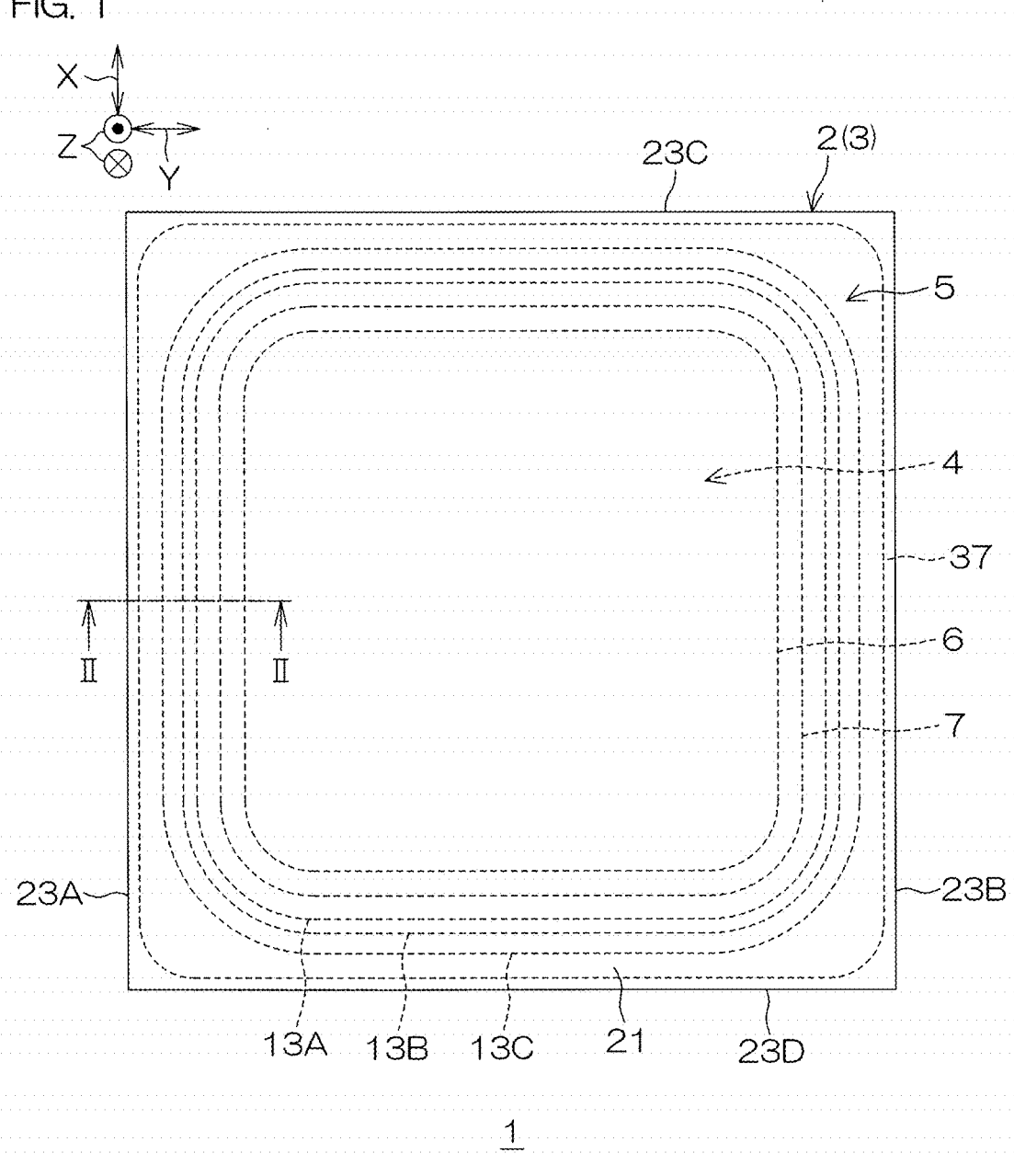
FIG. 1 is a plan view which shows a semiconductor device according to a first preferred embodiment of the present disclosure.
Figure 2:
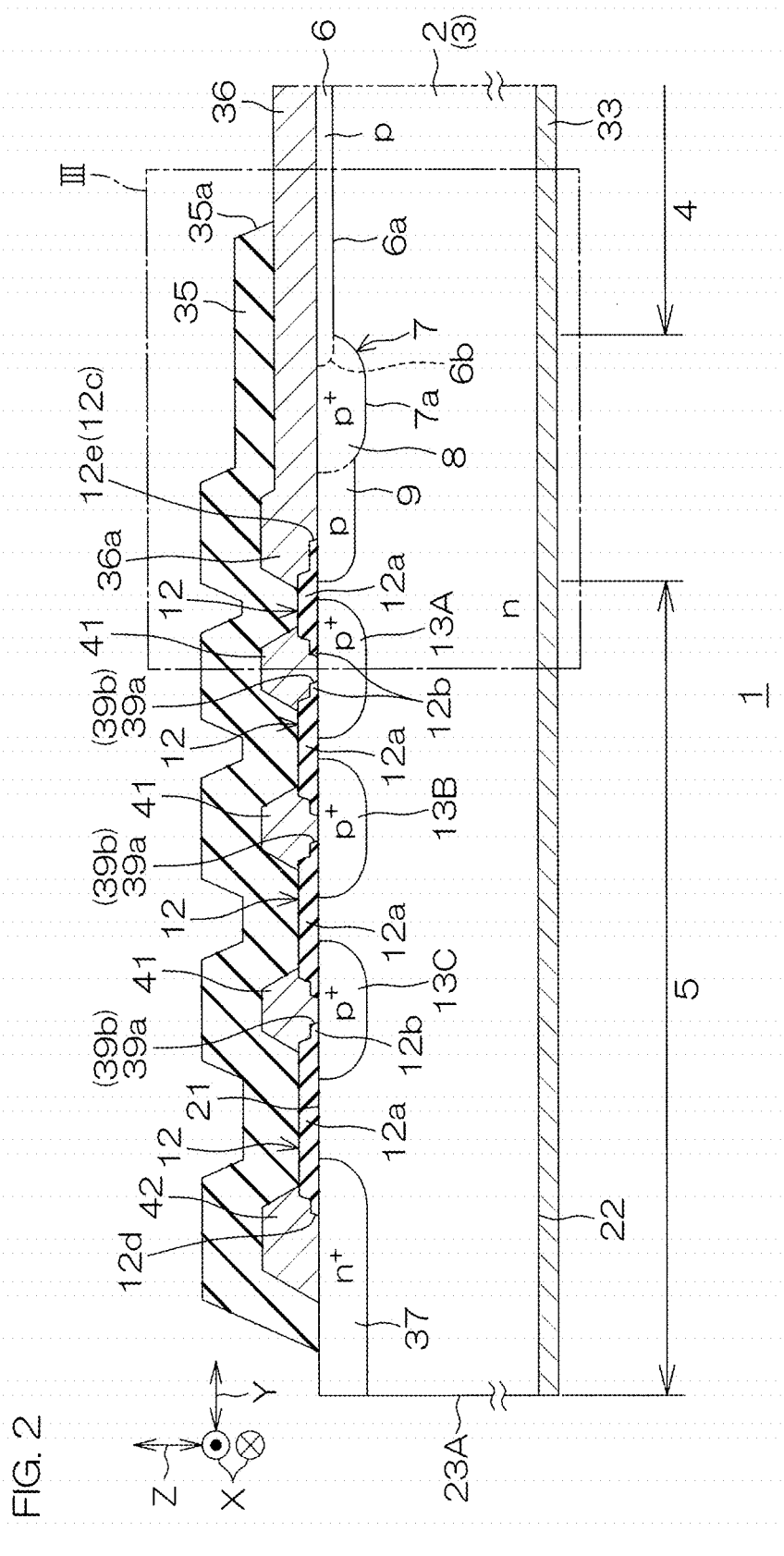
FIG. 2 is a sectional view taken along line II-II shown in FIG. 1.
Figure 3:
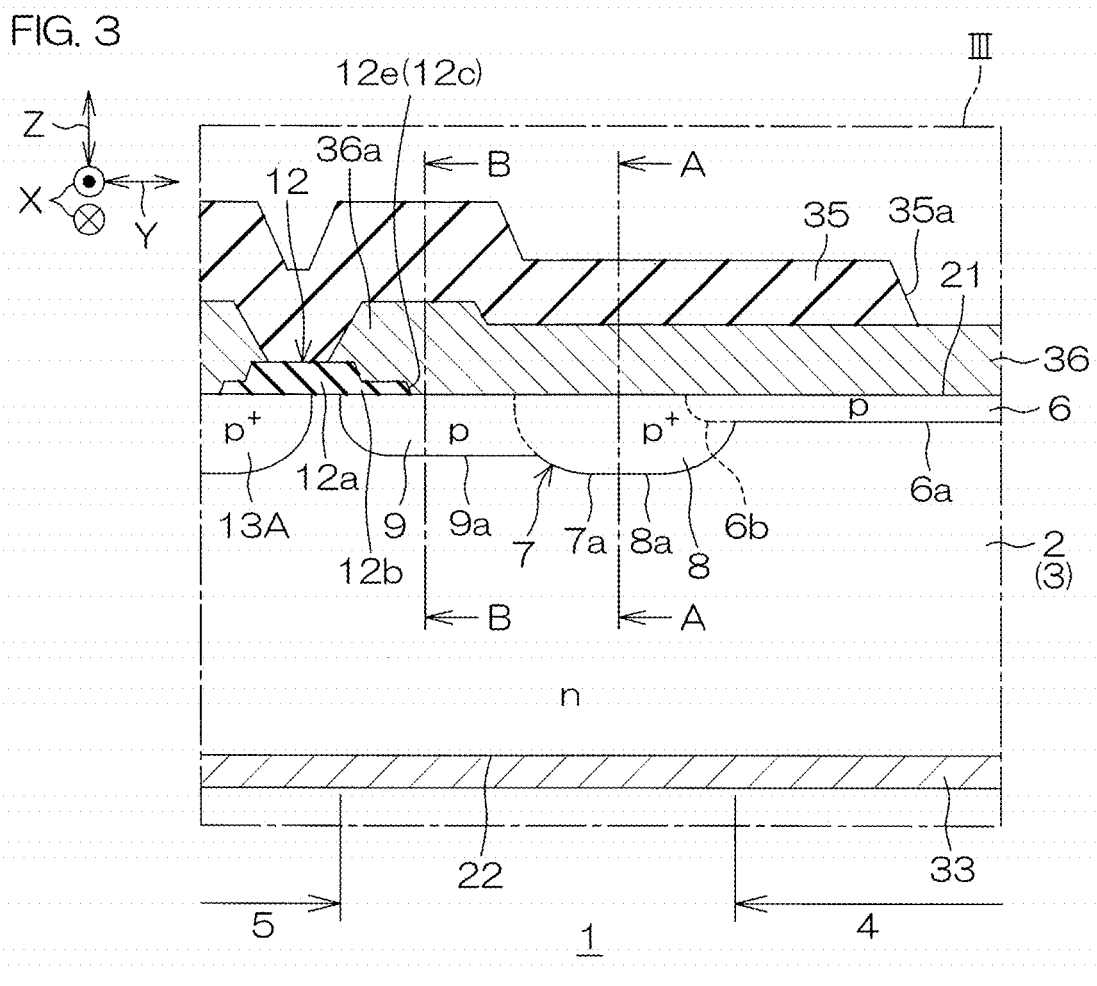
FIG. 3 is an enlarged view of a region III shown in FIG. 2.
Figure 4:
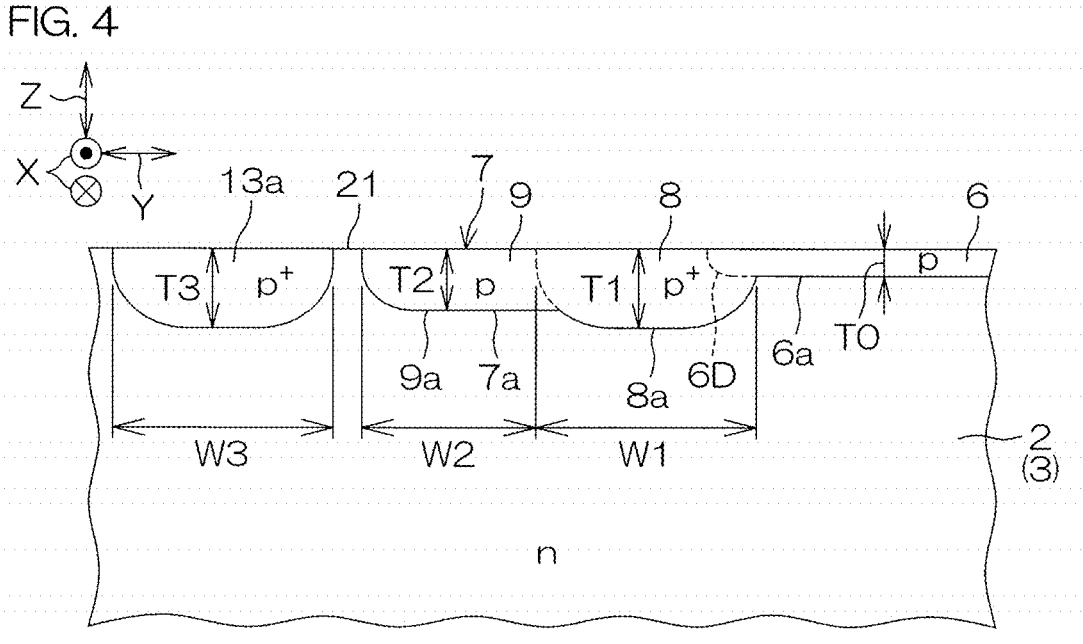
FIG. 4 is an enlarged sectional view showing a vicinity of a well region shown in FIG. 1.

FIG. 1 is a plan view which shows a semiconductor device 1 according to a first preferred embodiment of the present disclosure. FIG. 2 is a sectional view taken along line II-II shown in FIG. 1. FIG. 3 is an enlarged view of a region III shown in FIG. 2. FIG. 4 is an enlarged sectional view showing a vicinity of a well region 7. The semiconductor device 1 is a semiconductor rectifier device which includes a pn junction diode as one example of a functional device. In this preferred embodiment, the pn junction diode is constituted of a fast recovery diode.

With reference to FIG. 1 to FIG. 4, the semiconductor device 1 includes a semiconductor chip 2 of rectangular parallelepiped shape. The semiconductor chip 2 is constituted of an Si (silicon) chip. The semiconductor chip 2 has a first principal surface 21 on one side, a second principal surface 22 on the other side, and first to fourth side surfaces 23A to 23D that connect the first principal surface 21 and the second principal surface 22. The first principal surface 21 and the second principal surface 22 are formed into a quadrilateral shape in plan view as viewed from a normal direction Z thereto (hereinafter referred to simply as "plan view").

The first principal surface 21 is a device surface in which a functional device is formed. The second principal surface 22 is a non-device surface. The first side surface 23A and the second side surface 23B extend in a first direction X along the first principal surface 21 and oppose a second direction Y which intersects with the first direction X (specifically, orthogonal thereto). The third side surface 23C and the fourth side surface 23D extend in the second direction Y and oppose the first direction X.

The semiconductor chip 2 includes at least an n type (a first conductive type) semiconductor layer 3 which is formed on a surface layer portion of the first principal surface 21. An n type impurity concentration of the semiconductor layer 3 may be not less than $1.0 \times 10^{13}$ cm$^{-3}$ and not more than $1.0 \times 10^{16}$ cm$^{-3}$. A semiconductor layer 3 is exposed from the first principal surface 21. That is, the semiconductor layer 3 has the first principal surface 21. In this preferred embodiment, the semiconductor layer 3 is formed over the entire region of the surface layer portion of the first principal surface 21 and exposed from the first principal surface 21 and the first to fourth side surfaces 23A to 23D.

Specifically, the semiconductor layer 3 is formed over the entire region in the width direction and thickness direction of the semiconductor chip 2. That is, the semiconductor chip 2 has a single layer structure constituted of the semiconductor layer 3. The semiconductor layer 3 is formed as a cathode region of the pn junction diode. Hereinafter, a description will be given by using the semiconductor layer 3 in place of the semiconductor chip 2.

The semiconductor device 1 includes a p type (a second conductive type) well region 7 which is formed on the surface layer portion of the first principal surface 21. The well region 7 forms a pn junction portion with the semiconductor layer 3. The well region 7 is formed inside the semiconductor layer 3 at intervals from a peripheral edge of the first principal surface 21 (that is, the first to fourth side surfaces 23A to 23D) and formed in a band shape extending along the peripheral edge of the first principal surface 21 in plan view.

Specifically, the well region 7 is formed in an annular shape which surrounds an internal portion of the semiconductor layer 3 in plan view. In this preferred embodiment, the well region 7 is formed in a quadrilateral annular shape that is parallel to each side of the first principal surface 21 in plan view. Four corners of the well region 7 are each formed in a circular arc shape moving from an internal portion of the first principal surface 21 toward a peripheral edge portion thereof.

The well region 7 demarcates an active region 4 on the internal portion side of the first principal surface 21 and demarcates an outer region 5 on the peripheral edge portion side of the first principal surface 21. Specifically, the well region 7 demarcates the active region 4 by an inner edge and demarcates the outer region 5 by an outer edge. The active region 4 is demarcated in a quadrilateral shape having four sides parallel to each side of the first principal surface 21 (that is, the first to fourth side surfaces 23A to 23D) in plan view. The outer region 5 is demarcated in a quadrilateral annular shape having four sides parallel to each side of the first principal surface 21 (that is, the first to fourth side surfaces 23A to 23D) in plan view.

The well region 7 includes a high concentration portion 8 and a low concentration portion 9. The high concentration portion 8 is formed on the active region 4 side and has a relatively high p type impurity concentration. The low concentration portion 9 is formed on the outer region 5 side with respect to the high concentration portion 8 and has a p type impurity concentration which is less than a p type impurity concentration of the high concentration portion 8. The high concentration portion 8 and the low concentration portion 9 are referred respectively to as a "high concentration portion" and a "low concentration portion" based on a difference in p type impurity concentration between them.

However, for example, the high concentration portion may be referred to as a "first concentration portion having a first impurity concentration" and the low concentration portion may be referred to as a "second concentration portion having a second impurity concentration lower than the first impurity concentration."

The high concentration portion 8 is formed in an annular shape which surrounds the internal portion of the semiconductor layer 3 in plan view. The low concentration portion 9 is integrally formed with the high concentration portion 8 and formed in an annular shape which surrounds the high concentration portion 8 in plan view. That is, the well region 7 demarcates the active region 4 by the high concentration portion 8 and demarcates the outer region 5 by the low concentration portion 9.

The p type impurity concentration of the low concentration portion 9 may be not less than 0.1 times and not more than 0.8 times the p type impurity concentration of the high concentration portion 8. The p type impurity concentration of the low concentration portion 9 is preferably not less than 0.2 times and not more than 0.5 times the p type impurity concentration of the high concentration portion 8. The p type impurity concentration of the high concentration portion 8 may be not less than $1 \times 10^{17}$ cm$^{-3}$ and not more than $1 \times 10^{18}$ cm$^{3}$. The p type impurity concentration of the low concentration portion 9 may be not less than $1 \times 10^{16}$ cm$^{-3}$ and not more than $1 \times 10^{17}$ cm$^{-3}$.

A bottom portion 7a of the well region 7 is formed with a bottom portion 8a of the high concentration portion 8 and a bottom portion 9a of the low concentration portion 9. The bottom portion 9a of the low concentration portion 9 is formed on the first principal surface 21 side with respect to a depth position of the bottom portion 8a of the high concentration portion 8. Therefore, the bottom portion 7a of the well region 7 is recessed to the bottom portion 9a of the low concentration portion 9 from the bottom portion 8a of the high concentration portion 8.

With reference to FIG. 4, the high concentration portion 8 has a first thickness T1 and a first width W1. The first thickness T1 is a thickness of the high concentration portion 8 along a thickness direction (normal direction Z) of the semiconductor layer 3. The first width W1 is a width in a direction orthogonal to a direction in which the high concentration portion 8 extends. The first width W1 may be a maximum width among the widths of the high concentration portion 8 measured in the direction orthogonal to the direction in which the high concentration portion 8 extends.

The first thickness T1 may be not less than 1 μm and not more than 15 μm. The first thickness T1 is preferably not less than 5 μm and not more than 12 μm. The first width W1 may be not less than 10 μm and not more than 30 μm. The first width W1 is preferably not less than 25 μm and not more than 30 μm. The high concentration portion 8 has a horizontally long structure in which W1/T1, a ratio of the first width W1 in relation to the first thickness T1 exceeds 1 in sectional view. The ratio W1/T1 is preferably in excess of 1 and not more than 5.

The low concentration portion 9 has a second thickness T2 and a second width W2. The second thickness T2 is a thickness of the low concentration portion 9 of the semiconductor layer 3 along a thickness direction (normal direction Z) when the first principal surface 21 is given as a reference. The second width W2 is a width in a direction orthogonal to a direction in which the low concentration portion 9 extends. The second width W2 may be a maximum width among the widths of the low concentration portion 9 measured in the direction orthogonal to the direction in which the low concentration portion 9 extends.

The second thickness T2 is preferably less than first thickness T1 (T2<T1). The second thickness T2 may be not less than 1 µm and not more than 15 µm. The second thickness T2 is preferably not less than 4 µm and not more than 10 µm.

The second width W2 may be not less than 10 µm and not more than 30 µm. The second width W2 is preferably not less than 12 µm and not more than 20 µm. The second width W2 is preferably less than the first width W1 of the high concentration portion 8 (W2<W1). The low concentration portion 9 preferably has a horizontally long structure in which W2/T2, a ratio of the second width W2 in relation to the second thickness T2 exceeds 1 in sectional view. The ratio of W2/T2 is preferably in excess of 1 and not more than 5.

Figure 5:
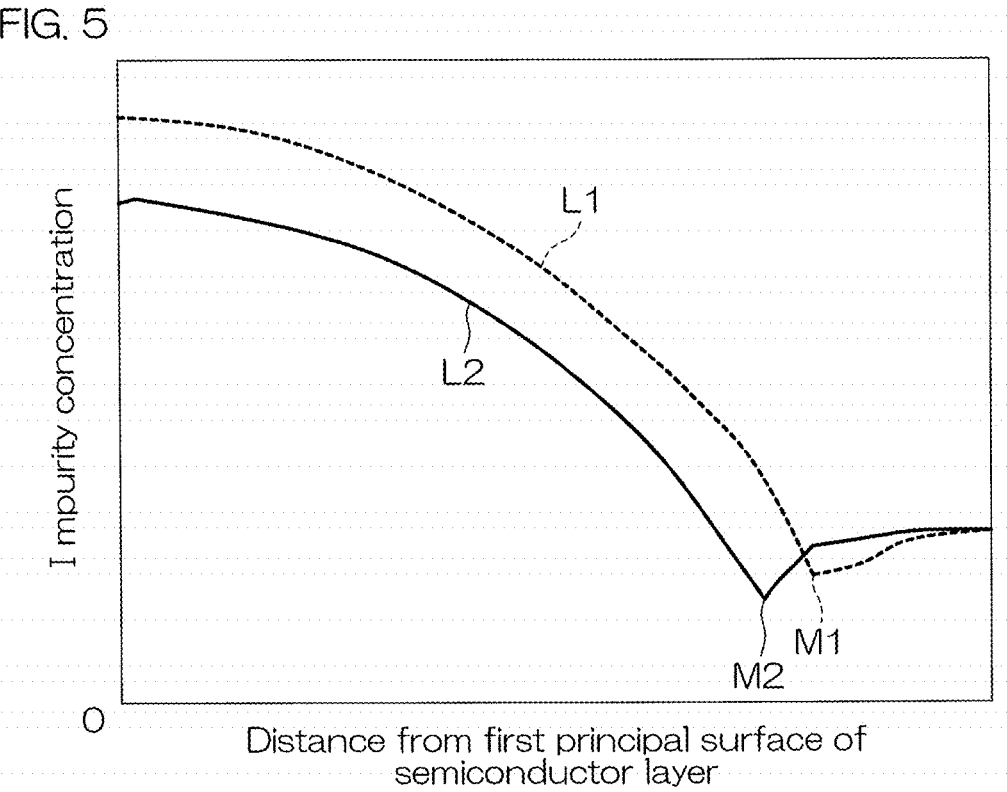
FIG. 5 is a graph which shows a concentration gradient of the well region in a thickness direction shown in in FIG. 1.

Hereinafter, a concentration gradient of the well region 7 will be specifically described with reference to FIG. 5 and FIG. 6. FIG. 5 is a graph which shows a thickness-direction concentration gradient of the well region 7 shown in FIG. 1. In FIG. 5, the abscissa indicates a distance in the thickness direction, with the first principal surface 21 given as a zero point, and the ordinate indicates a p type impurity concentration of the well region 7.

FIG. 5 shows a first curved line L1 and a second curved line L2. The first curved line L1 indicates a p type impurity concentration gradient of a portion of the high concentration portion 8 along line A-A shown in FIG. 3. The second curved line L2 indicates a p type impurity concentration gradient of a portion of the low concentration portion 9 along line B-B shown in FIG. 3.

With reference to the first curved line L1, the high concentration portion 8 has a concentration gradient in which the p type impurity concentration is gradually decreased from the first principal surface 21 toward the thickness direction of the semiconductor layer 3. With reference to the second curved line L2, the low concentration portion 9 has a concentration gradient in which the p type impurity concentration is gradually decreased from the first principal surface 21 toward the thickness direction of the semiconductor layer 3. With reference to the first curved line L1 and the second curved line L2, the p type impurity concentration of the low concentration portion 9 is lower than the p type impurity concentration of the high concentration portion 8 over an entire region in the thickness direction of the low concentration portion 9, when the same thickness position is given as a reference.

Further, with reference to the first curved line L1, the high concentration portion 8 has a first minimum value M1. The first minimum value M1 indicates a boundary (pn junction portion) between the high concentration portion 8 and the semiconductor layer 3. With reference to the second curved line L2, the low concentration portion 9 has a second minimum value M2. The second minimum value M2 indicates a boundary (pn junction portion) between the low concentration portion 9 and the semiconductor layer 3. The bottom portion 9a of the low concentration portion 9 is positioned on the first principal surface 21 side with respect to the bottom portion 8a of the high concentration portion 8 and, therefore, the second minimum value M2 is positioned on the left side of the graph from the first minimum value M1. That is, the pn junction portion of the low concentration portion 9 is positioned in a region on the first principal surface 21 side with respect to the pn junction portion of the high concentration portion 8.

Figure 6:
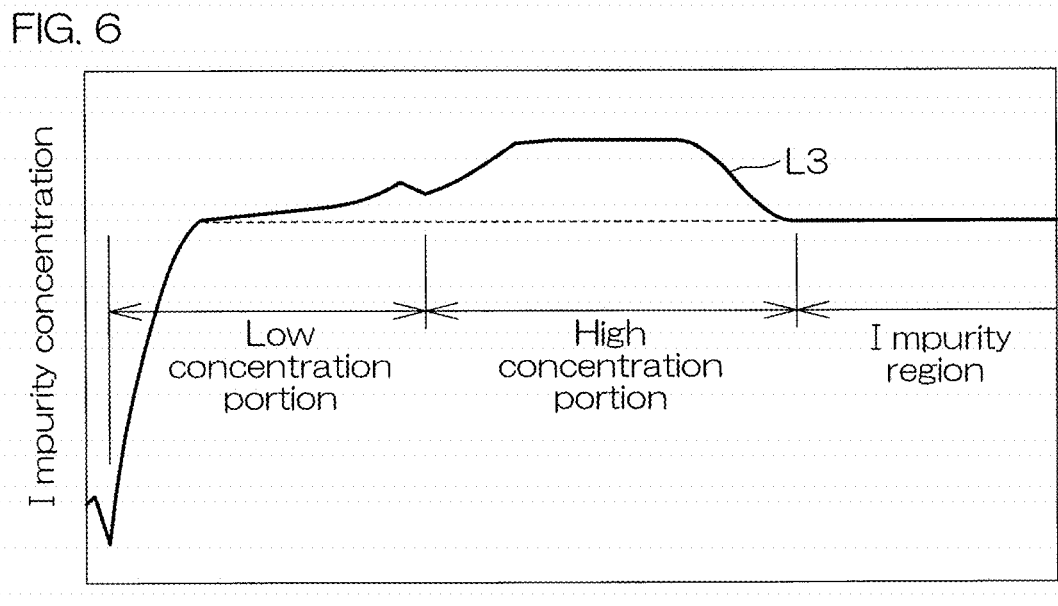
FIG. 6 is a graph which shows a concentration gradient of the well region in a width direction shown in FIG. 1.

FIG. 6 is a graph which shows a width-direction concentration gradient of the well region 7 shown in FIG. 1. In FIG. 6, the abscissa indicates a position along a direction orthogonal to a direction in which the well region 7 extends. The ordinate indicates a p type impurity concentration of a surface layer portion of the well region 7. FIG. 6 shows a third curved line L3. The third curved line L3 indicates a p type impurity concentration gradient of the well region 7 in the width direction at a certain thickness position from the first principal surface 21. The third curved line L3 also indicates a p type impurity concentration of the impurity region 6 which is to be described later.

With reference to the third curved line L3, the well region 7 has a concentration gradient in which the p type impurity concentration is gradually decreased from the high concentration portion 8 to the low concentration portion 9. As understood by a shift from the first curved line L1 to the second curved line L2 shown in FIG. 5, the well region 7 has a concentration gradient in which the p type impurity concentration is gradually decreased from an entire region in the thickness direction of the high concentration portion 8 to an entire region of the low concentration portion 9. That is, the p type impurity concentration of the low concentration portion 9 is less than the p type impurity concentration of the high concentration portion 8 at a thickness position equal in distance from the first principal surface 21.

Again, with reference to FIG. 2 and FIG. 3, the semiconductor device 1 includes a p type impurity region 6 of the active region 4 which is formed on the surface layer portion of the first principal surface 21. The impurity region 6 forms a pn junction portion with the semiconductor layer 3. In the active region 4, there is formed a pn junction diode (a fast recovery diode) which includes the semiconductor layer 3 as a cathode region and the impurity region 6 as an anode region.

The impurity region 6 has a region thickness T0. The region thickness T0 is a thickness of the impurity region 6 along the thickness direction (normal direction Z) of the semiconductor layer 3. The region thickness T0 is less than the first thickness T1 of the high concentration portion 8 (T0<T1). That is, the bottom portion 6a of the impurity region 6 is formed on the first principal surface 21 side with respect to a depth position of the bottom portion 8a of the high concentration portion 8. In this preferred embodiment, the region thickness T0 is less than the second thickness T2 of the low concentration portion 9 (T0<T2). That is, the bottom portion 6a of the impurity region 6 is formed on the first principal surface 21 side with respect to the depth position of the bottom portion 9a of the low concentration portion 9.

The impurity region 6 is formed in the active region 4 so as to be connected to the high concentration portion 8 of the well region 7 and fixed at the same potential as the well region 7. The outer edge portion 6b of the impurity region 6 is connected to the high concentration portion 8 over an entire region (entire periphery) of the inner edge of the well region 7. In this preferred embodiment, the impurity region 6 is formed over the entire active region 4. The outer edge portion 6b of the impurity region 6 includes a p type impurity of the high concentration portion 8. That is, the outer edge portion 6b of the impurity region 6 is increased in p type impurity concentration by the amount of the p type impurity of the high concentration portion 8.

The p type impurity concentration of the impurity region 6 has a concentration gradient in which the p type impurity concentration is decreased gradually from the first principal surface 21 toward the thickness direction of the semiconductor layer 3. As understood from the third curved line L3 in FIG. 6, the impurity region 6 has a p type impurity concentration less than the p type impurity concentration of the well region 7. Specifically, the p type impurity concentration of the impurity region 6 is less than the p type impurity concentration of the high concentration portion 8 of the well region 7.

The p type impurity concentration of the impurity region 6 is preferably less than the p type impurity concentration of the high concentration portion 8 over the entire region in the thickness direction of the impurity region 6. The p type impurity concentration of the impurity region 6 is more preferably less than the p type impurity concentration of the low concentration portion 9. Specifically, the p type impurity concentration of the impurity region 6 is in particular preferably less than the p type impurity concentration of the low concentration portion 9 at a thickness position equal in distance from the first principal surface 21. The p type impurity concentration of the impurity region 6 may be not less than $5 \times 10^{15}$ cm$^{-3}$ and not more than $5 \times 10^{16}$ cm$^{-3}$.

With reference to FIG. 1 to FIG. 4, the semiconductor device 1 includes at least one p type field limit region of the outer region 5 which is formed on the surface layer portion of the first principal surface 21. Hereinafter, the field limit region is abbreviated as the FL (Field Limit) region. FIG. 2 shows an example in which three p type FL regions, 13A, 13B, 13C, are formed in this order at intervals from the well region 7 to a peripheral edge of the first principal surface 21. The number of FL regions is adjusted depending on an electric field to be relaxed and may be not less than one and not more than 20. The number of FL regions is preferably not less than 4.

The FL regions 13A to 13C are each formed in an electrically floating state. The FL regions 13A to 13C each extend in a band shape along the well region 7 in plan view. Specifically, the FL regions 13A to 13C are each formed in an annular shape which surrounds the well region 7 in plan view. Thereby, the FL regions 13A to 13C are each formed as an FLR (Field Limiting Ring) region.

The FL regions 13A to 13C have a concentration gradient in which the p type impurity concentration is gradually decreased from the first principal surface 21 toward a thickness direction. The FL regions 13A to 13C have the p type impurity concentration exceeding the p type impurity concentration of the impurity region 6. The FL regions 13A to 13C are higher in p type impurity concentration than the low concentration portion 9 over an entire region in the thickness direction of the FL regions 13A to 13C.

When central portions of the FL regions 13A to 13C and a central portion of the low concentration portion 9 are given as a reference, specifically, the p type impurity concentrations of the FL regions 13A to 13C are higher than the p type impurity concentration of the low concentration portion 9 at a thickness position equal in distance from the first principal surface 21. The impurity concentrations of the FL regions 13A to 13C may be substantially equal to the p type impurity concentration of the high concentration portion 8. The p type impurity concentrations of the FL regions 13A to 13C may be not less than $1 \times 10^{17}$ cm$^{-3}$ and not more than $1 \times 10^{18}$ cm$^{-3}$.

Each of the FL regions 13A to 13C has a third thickness T3 and a third width W3. The third thickness T3 is a thickness of each of the FL regions 13A to 13C along the thickness direction (normal direction Z) of the semiconductor layer 3, when the first principal surface 21 is given as a reference. The third width W3 is a width in a direction orthogonal to a direction in which the FL regions 13A to 13C extend. The third width W3 may be a maximum width among the widths of the FL regions 13A to 13C measured in the direction orthogonal to the direction in which the FL regions 13A to 13C extend.

The third thickness T3 may be not less than 1 μm and not more than 15 μm. The third thickness T3 is preferably not less than 5 μm and not more than 12 μm. The third thickness T3 preferably exceeds the region thickness T0 of the impurity region 6 (T0<T3). In particular, the third thickness T3 preferably exceeds the second thickness T2 of the low concentration portion 9 (T2<T3). The third thickness T3 is preferably substantially equal to the first thickness T1 of the high concentration portion 8 (T1≈T3).

The FL regions 13A to 13C are adjusted for the third thickness T3 depending on an electric field to be relaxed. Each of the FL regions 13A to 13C may have the third thickness T3 which is substantially equal to each other or may have the third thickness T3 which is different from each other. The third thickness T3 of each of the FL regions 13A to 13C may be formed so as to be gradually decreased from the well region 7 side to the peripheral edge side of the first principal surface 21.

The third width W3 may be equal to or larger than the first width W1 of the high concentration portion 8 (W1≤W3). The third width W3 preferably exceeds the first width W1 (W1<W3). The third width W3 may be equal to or larger than the second width W2 of the low concentration portion 9 (W2≤W3). The third width W3 preferably exceeds the second width W2 (W2<W3). The third width W3 is in particular preferably less than W1+W2, a total value of the first width W1 and the second width W2 (W3<W1+W2). The third width W3 may be not less than 10 μm and not more than 50 μm. The third width W3 is preferably not less than 25 μm and not more than 45 μm.

The FL regions 13A to 13C are adjusted for the third width W3 depending on an electric field to be relaxed. The FL regions 13A to 13C may have the third width W3 which is substantially equal to each other or may have the third width W3 which is different from each other. The third width W3 of each of the FL regions 13A to 13C may be formed so as to be gradually decreased from the well region 7 side to the peripheral edge side of the first principal surface 21. The FL regions 13A to 13C may be formed in an order that the third width W3 of the FL region 13A is larger than the third width W3 of the FL region 13B, which is then larger than the third width W3 of the FL region 13C. In this case, a total value of the third widths W3 of the FL regions 13A to 13C can be made small to downsize the semiconductor chip 2.

Each of the FL regions 13A to 13C preferably has a horizontally long structure in which W3/T3, a ratio of the third width W3 in relation to the third thickness T3 exceeds 1 in sectional view. The ratio of W3/T3 is preferably in excess of 1 and not more than 5.

The semiconductor device 1 includes an n type channel stop region 37 of the outer region 5 which is formed on a surface layer portion of the peripheral edge portion of the first principal surface 21. The channel stop region 37 has an n type impurity concentration exceeding the n type impurity concentration of the semiconductor layer 3 and is formed in an electrically floating state. The channel stop region 37 is formed at intervals from the outermost FL region 13C on the peripheral edge side of the first principal surface 21 (that is, the first to fourth side surfaces 23A to 23D).

The channel stop region 37 is formed in a band shape which extends along the peripheral edge of the first principal surface 21 in plan view. In this preferred embodiment, the channel stop region 37 extends along the peripheral edge of the first principal surface 21 in plan view and is formed in an annular shape which surrounds the plurality of FL regions 13A to 13C. The channel stop region 37 is preferably exposed from the first to fourth side surfaces 23A to 23D.

With reference to FIG. 2, the semiconductor device 1 includes a principal surface insulating film 12 which selectively covers the first principal surface 21. The principal surface insulating film 12 may include an oxide film (SiO₂ film) or may include a nitride film (SiN film). The oxide film may include a LOCOS (Local Oxidation Of Silicon) film. A thickness of the principal surface insulating film 12 may be not less than 0.5 μm and not more than 5 μm. The thickness of the principal surface insulating film 12 is preferably not less than 1 μm and not more than 3 μm.

The principal surface insulating film 12 includes a thick film portion 12a having a first insulating thickness and a thin film portion 12b having a second insulating thickness less than the first insulating thickness. The thick film portion 12a covers a region between the well region 7 and the innermost FL region 13A, regions between neighboring FL regions 13A to 13C and a region between the outermost FL region 13C and the channel stop region 37.

The thick film portion 12a extends in a band shape (specifically, in an annular shape) in the region between the well region 7 and the innermost FL region 13A in plan view. The thick film portion 12a covers an outer edge portion of the well region 7 and an inner edge portion of the innermost FL region 13A. The thick film portion 12a covers the low concentration portion 9 of the well region 7 so as to expose the high concentration portion 8 of the well region 7. Specifically, the thick film portion 12a covers the outer edge portion of the low concentration portion 9 so as to expose an entire region of the high concentration portion 8 and a part of the low concentration portion 9.

The thick film portion 12a extends in a band shape (specifically, in an annular shape) in the regions between the neighboring FL regions 13A to 13C in plan view. The thick film portion 12a covers each of the outer edge portions and the inner edge portions of the neighboring FL regions 13A to 13C. The thick film portion 12a extends in a band shape (specifically, in an annular shape) in a region between the outermost FL region 13C and the channel stop region 37 which are adjacent to each other in plan view. The thick film portion 12a covers the outer edge portion of the outermost FL region 13C and the inner edge portion of the channel stop region 37.

The thin film portion 12b selectively covers the first principal surface 21 of the outer region 5. Specifically, the thin film portion 12b covers respectively the well region 7, the FL regions 13A to 13C and the channel stop region 37. The thin film portion 12b is integrally formed with the thick film portion 12a in a peripheral edge portion of the well region 7 (peripheral edge portion of the low concentration portion 9), a peripheral edge portion of each of the FL regions 13A to 13C and a peripheral edge portion of the channel stop region 37.

The thin film portion 12b covers the peripheral edge portion of the well region 7 and extends in a band shape (specifically, in an annular shape) along the peripheral edge portion of the well region 7 in plan view. Specifically, the thin film portion 12b covers the low concentration portion 9 so as to expose the high concentration portion 8 of the well region 7. More specifically, the thin film portion 12b partially covers the low concentration portion 9 so as to expose an entire region of the high concentration portion 8 and a part of the low concentration portion 9. The thin film portion 12b is formed in a band shape (specifically, in an annular shape) extending along the low concentration portion 9 in plan view. The thin film portion 12b is integrally formed with the thick film portion 12a on the low concentration portion 9.

The principal surface insulating film 12 has a first opening 12e which exposes the impurity region 6. The first opening 12e is demarcated by the thin film portion 12b. A wall portion 12c of the first opening 12e is positioned on the well region 7. Thereby, the first opening 12e exposes a part of the impurity region 6 and that of the well region 7. The wall portion 12c may have an inclination angle which is an acute angle with respect to the principal surface insulating film 12. Specifically, the inclination angle of the wall portion 12c is an angle which is formed between the wall portion 12c and the first principal surface 21 inside the principal surface insulating film 12. The inclination angle may be not less than 25° and not more than 65°. The inclination angle is preferably not less than 30° and not more than 55°.

The wall portion 12c of the first opening 12e is formed at intervals from the high concentration portion 8 of the well region 7 on the low concentration portion 9 side and positioned on the low concentration portion 9 of the well region 7. The wall portion 12c of the first opening 12e is preferably positioned on the peripheral edge portion side of the low concentration portion 9 with respect to a central portion of the low concentration portion 9. The wall portion 12c of the first opening 12e extends along the low concentration portion 9 in plan view. That is, the first opening 12e is formed in a quadrilateral shape in plan view.

The first opening 12e exposes an entire region of the impurity region 6, an entire region of the high concentration portion 8 and a part of the low concentration portion 9. A plane area of a portion of the low concentration portion 9 which is exposed from the principal surface insulating film 12 preferably exceeds a plane area of a portion of the low concentration portion 9 which is covered by the principal surface insulating film 12. A plane area of a portion of the low concentration portion 9 which is covered by the thin film portion 12b preferably exceeds a plane area of a portion of the low concentration portion 9 which is covered by the thick film portion 12a.

The principal surface insulating film 12 has a plurality of second openings 39a which respectively expose the plurality of FL regions 13A to 13C. The plurality of second openings 39a are each formed in the thin film portion 12b and expose the plurality of FL regions 13A to 13C so as to respectively correspond thereto on a one-to-one basis. Each of the second openings 39a is formed in a band shape along each of the FL regions 13A to 13C. Each of the second openings 39a is preferably formed in an annular shape extending along each of the FL regions 13A to 13C.

A wall portion 39b of each of the second openings 39a is positioned on each of the FL regions 13A to 13C. Thereby, each of the second openings 39a exposes an internal portion of each of the FL regions 13A to 13C. A plane area of a portion covered by the principal surface insulating film 12 in each of the FL regions 13A to 13C preferably exceeds a plane area of a portion exposed from the principal surface insulating film 12 in each of the FL regions 13A to 13C.

The principal surface insulating film 12 has a third opening 12d which exposes the channel stop region 37. The third opening 12d is formed in the thin film portion 12b. The third opening 12d is formed in a band shape extending along the channel stop region 37 in plan view. The third opening 12d is preferably formed in an annular shape extending along the channel stop region 37 in plan view.

In this preferred embodiment, the third opening 12*d* is formed as a notched opening which communicatively connects the first to fourth side surfaces 23A to 23D. A plane area of a portion of the channel stop region 37 covered by the thin film portion 12*b* preferably exceeds a plane area of a portion of the channel stop region 37 covered by the thick film portion 12*a*.

The semiconductor device 1 includes a first principal surface electrode 36 which is connected to the impurity region 6 on the first principal surface 21. In this preferred embodiment, the first principal surface electrode 36 is constituted of an anode electrode. The first principal surface electrode 36 covers an entire region of the impurity region 6. The first principal surface electrode 36 is led out onto the well region 7 from above the impurity region 6 and connected to the impurity region 6 and the well region 7. Specifically, the first principal surface electrode 36 is connected to the high concentration portion 8 of the well region 7. More specifically, the first principal surface electrode 36 is connected to an entire region of the high concentration portion 8 of the well region 7 and a part of the low concentration portion 9 thereof.

The first principal surface electrode 36 has a lead-out portion 36*a* which is led out onto the principal surface insulating film 12 from above the well region 7. The lead-out portion 36*a* opposes the low concentration portion 9 of the well region 7 across the thin film portion 12*b* of the principal surface insulating film 12. In addition, the lead-out portion 36*a* opposes the low concentration portion 9 of the well region 7 across the thick film portion 12*a* of the principal surface insulating film 12.

A connecting area of a portion of the first principal surface electrode 36 which is connected to the well region 7 preferably exceeds an opposing area of a portion of the first principal surface electrode 36 which opposes the well region 7 across the principal surface insulating film 12. Further, an opposing area of a portion of the lead-out portion 36*a* which opposes the low concentration portion 9 across the thin film portion 12*b* preferably exceeds an opposing area of a portion of the lead-out portion 36*a* which opposes the low concentration portion 9 across the thick film portion 12*a*.

The semiconductor device 1 includes a plurality of respective field electrodes 41 which are respectively connected to the plurality of FL regions 13A to 13C on the first principal surface 21. Each of the field electrodes 41 is formed in an electrically floating state. The plurality of field electrodes 41 respectively enter into the plurality of second openings 39*a* from above the principal surface insulating film 12 and are respectively connected to the plurality of FL regions 13A to 13C inside the plurality of second openings 39*a* so as to respectively correspond thereto on a one-to-one basis. Each of the field electrodes 41 is formed in a band shape extending along each of the FL regions 13A to 13C in plan view. Each of the field electrodes 41 is preferably formed in an annular shape extending along each of the FL regions 13A to 13C in plan view.

The semiconductor device 1 includes an equipotential electrode 42 which is connected to the channel stop region 37 on the first principal surface 21. The equipotential electrode 42 enters into the third opening 12*d* from above the principal surface insulating film 12 and is connected to the channel stop region 37 inside the third opening 12*d*. The equipotential electrode 42 is formed in a band shape extending along the channel stop region 37 in plan view. The equipotential electrode 42 is preferably formed in an annular shape extending along the channel stop region 37 in plan view. The equipotential electrode 42 is preferably formed at intervals from the first to fourth side surfaces 23A to 23D to the internal portion side of the semiconductor layer 3 so as to expose a part of the channel stop region 37.

The semiconductor device 1 includes an organic insulating film 35 which covers the principal surface insulating film 12. The organic insulating film 35 covers the first principal surface electrode 36, the plurality of field electrodes 41 and the equipotential electrode 42 on the principal surface insulating film 12. The organic insulating film 35 has an elastic coefficient smaller than that of an inorganic insulating film (for example, the principal surface insulating film 12) and functions as a cushioning material (protective film) against an external force. The organic insulating film 35 includes a photosensitive resin. The photosensitive resin may be a negative type or a positive type. The organic insulating film 35 may contain at least one type of polyimide, polyamide and polybenzoxazole. In this preferred embodiment, the organic insulating film 35 contains polyimide.

The organic insulating film 35 covers the lead-out portion 36*a* of the first principal surface electrode 36 on the active region 4 side. That is, the organic insulating film 35 opposes the high concentration portion 8 and the low concentration portion 9 of the well region 7 across the lead-out portion 36*a* of the first principal surface electrode 36. The organic insulating film 35 has a pad opening 35*a* which exposes an internal portion of the first principal surface electrode 36 as a pad portion. The pad opening 35*a* may be formed in a quadrilateral shape which has four sides parallel to each side of the first principal surface electrode 36 in plan view. A wall surface of the pad opening 35*a* is preferably formed at intervals from an inner edge of the well region 7 inside the first principal surface electrode 36 in sectional view.

A peripheral edge portion of the organic insulating film 35 is formed internally at intervals from the first to fourth side surfaces 23A to 23D on the outer region 5 side to expose a part of the channel stop region 37. The peripheral edge portion of the organic insulating film 35 preferably covers an entire region of the equipotential electrode 42 and a part of the channel stop region 37 (first principal surface 21 of the semiconductor layer 3).

The semiconductor device 1 includes a second principal surface electrode 33 which covers the second principal surface 22. In this preferred embodiment, the second principal surface electrode 33 is constituted of a cathode electrode. The second principal surface electrode 33 forms an ohmic contact with the second principal surface 22 (semiconductor layer 3).

As described so far, the semiconductor device 1 includes the n type semiconductor layer 3, the p type well region 7 and the p type impurity region 6. The semiconductor layer 3 has the first principal surface 21. The well region 7 is formed on a surface layer portion of the first principal surface 21 and demarcates the active region 4 and the outer region 5 on the first principal surface 21. The well region 7 includes the high concentration portion 8 which has a relatively high p type impurity concentration on the active region 4 side and the low concentration portion 9 which has a p type impurity concentration less than the p type impurity concentration of the high concentration portion 8 on the outer region 5 side. The impurity region 6 is formed at a surface layer portion of the first principal surface 21 in the active region 4.

When the pn junction diode is in a recovery operation, a recovery current (reverse current) occurs from the cathode side to the anode side. The recovery operation refers to an operation that the pn junction diode returns to a steady state after being in an OFF state from an ON state. The well region 7 expands a depletion layer inside the semiconductor layer 3 at the time of recovery operation. Specifically, the well region 7 expands the depletion layer toward the active region 4 and the outer region 5 as it approaches a steady state at the time of recovery operation.

On the other hand, the impurity region 6 also expands the depletion layer inside the semiconductor layer 3 at the time of recovery operation. Specifically, the impurity region 6 expands the depletion layer toward the active region 4 and the outer region 5 as it approaches a steady state at the time of recovery operation. The depletion layer expanding from the impurity region 6 is integrally formed with the depletion layer expanding from the well region 7 and, therefore, extended from the active region 4 side to the outer region 5 side.

Thereby, the surface layer portion of the first principal surface 21 is reduced in current density to relax an electric field concentration on the surface layer portion of the first principal surface 21. The high concentration portion 8 is connected to the low concentration portion 9 in the well region 7, by which a concentration gradient in which the p type impurity concentration is gradually decreased from the high concentration portion 8 to the low concentration portion 9 is formed between the high concentration portion 8 and the low concentration portion 9. An electric field is relaxed by the concentration gradient as compared with the well region 7 having a certain p type impurity concentration, thereby suppressing a current concentration.

Further, the p type impurity concentration of the low concentration portion 9 is less than the p type impurity concentration of the high concentration portion 8 and, therefore, a resistance value of the low concentration portion 9 is higher than a resistance value of the high concentration portion 8. As a result, the recovery current flows through both the high concentration portion 8 and the low concentration portion 9. However, as compared with a case where the well region 7 is formed at a certain p type impurity concentration, the low concentration portion 9 having a relatively high resistance value is reduced in current density. From this point of view as well, the current concentration is suppressed.

As described above, according to the semiconductor device 1, it is possible to suppress an electric field concentration on the well region 7 and also suppress a decrease in withstand voltage which starts from the well region 7. In the semiconductor device 1, it is possible to suppress, in particular, an electric field concentration on the low concentration portion 9 which forms an outer edge portion of the well region 7. Specifically, the "withstand voltage" described here means a "RRSOA (Reverse Recovery Safe Operation Area) resistance." RRSOA stands for reverse recovery safe operation area, and the RRSOA resistance means a non-destructive operation range when a recovery current is applied. With an increase in RRSOA resistance, the non-destructive operation range is widened on application of a recovery current, thus realizing an excellent device.

The low concentration portion 9 preferably has a concentration gradient in which the p type impurity concentration is gradually decreased from the first principal surface 21 toward the thickness direction. The high concentration portion 8 preferably has a concentration gradient in which the impurity concentration is gradually decreased from the first principal surface 21 toward the thickness direction. The low concentration portion 9 preferably has a thickness less than a thickness of the high concentration portion 8. That is, the bottom portion 7a of the well region 7 is preferably recessed from the bottom portion 8a of the high concentration portion 8 to the bottom portion 9a of the low concentration portion 9.

The p type impurity concentration of the impurity region 6 is preferably lower than the p type impurity concentration of the high concentration portion 8. The impurity region 6 is preferably connected to the high concentration portion 8. In this case, a portion of the impurity region 6 which is connected to the high concentration portion 8 may be increased in p type impurity concentration of the internal portion of the impurity region 6 by the amount of the p type impurity of the high concentration portion 8 due to the p type impurity of the high concentration portion 8.

The well region 7 is preferably formed in an annular shape which surrounds an internal portion of the semiconductor layer 3 so as to demarcate the active region 4 in the internal portion of the semiconductor layer 3 and demarcate the outer region 5 in a peripheral edge portion of the semiconductor layer 3 in plan view. According to this structure, an electric field concentration can be relaxed by the well region 7 over an entire periphery of the active region 4. In this case, it is preferable that the high concentration portion 8 is formed in an annular shape which surrounds the internal portion of the semiconductor layer 3 in plan view and the low concentration portion 9 is formed in an annular shape which surrounds the high concentration portion 8 in plan view.

The semiconductor device 1 preferably further includes the first principal surface electrode 36 which is connected to the impurity region 6 on the first principal surface 21. In this case, the first principal surface electrode 36 is preferably connected to the high concentration portion 8. According to this structure, a recovery current can be discharged to the first principal surface electrode 36 from the high concentration portion 8 in addition to the impurity region 6. Thereby, it is possible to relax a current concentration (that is, the electric field concentration) on the well region 7.

In this structure, the first principal surface electrode 36 is preferably connected to the low concentration portion 9. According to this structure, a recovery current can be discharged to the first principal surface electrode 36 through the impurity region 6, the high concentration portion 8 and the low concentration portion 9. It is, thereby, possible to relax a current concentration (that is, the electric field concentration) on the well region 7. This structure is in particular effective in suppressing a current concentration (that is, the electric field concentration) on the low concentration portion 9.

The high concentration portion 8 preferably has the first thickness T1 and the first width W1 and has a horizontally long structure in which W1/T1, the ratio of the first width W1 in relation to the first thickness T1 exceeds 1 in sectional view. The low concentration portion 9 preferably has the second thickness T2 and the second width W2 and has a horizontally long structure in which W2/T2, the ratio of the second width W2 in relation to the second thickness T2 exceeds 1 in sectional view.

The semiconductor device 1 preferably further includes the p type FL regions 13A to 13D which are formed on the surface layer portion of the first principal surface 21 at intervals from the well region 7 in the outer region 5. According to this structure, the FL regions 13A to 13D expand a depletion layer inside the semiconductor layer 3 at the time of recovery operation. Specifically, the FL regions 13A to 13D expand a depletion layer to the active region 4 and the outer region 5, as it approaches a steady state at the time of recovery operation.

The depletion layer expanding from the FL regions 13A to 13D is integrally formed with the depletion layer expanding from the well region 7, thereby extending the depletion layer expanding from the well region 7 to the outer region 5 side from the active region 4 side. A current density of the surface layer portion of the first principal surface 21 is, thereby, further relaxed. The FL regions 13A to 13D (specifically, the innermost FL region 13A) further extend the depletion layer expanding from the low concentration portion 9 to the outer region 5 and, therefore, appropriately relaxing a current concentration (that is, the electric field concentration) on the low concentration portion 9.

The FL regions 13A to 13D preferably have the p type impurity concentration exceeding the p type impurity concentration of the impurity region 6. The FL regions 13A to 13D preferably have the p type impurity concentration exceeding the p type impurity concentration of the low concentration portion 9. The p type impurity concentration of the FL regions 13A to 13D is preferably higher than the p type impurity concentration of the low concentration portion 9 over an entire region in the thickness direction of the FL regions 13A to 13D. The FL regions 13A to 13D preferably have a thickness exceeding a thickness of the impurity region 6. The FL regions 13A to 13D preferably have a thickness exceeding a thickness of the low concentration portion 9.

FIG. 7A to FIG. 7J are each a sectional view of the portion corresponding to FIG. 2 and a sectional view for describing an example of a method for manufacturing the semiconductor device 1 shown in FIG. 1.

Figure 7A:
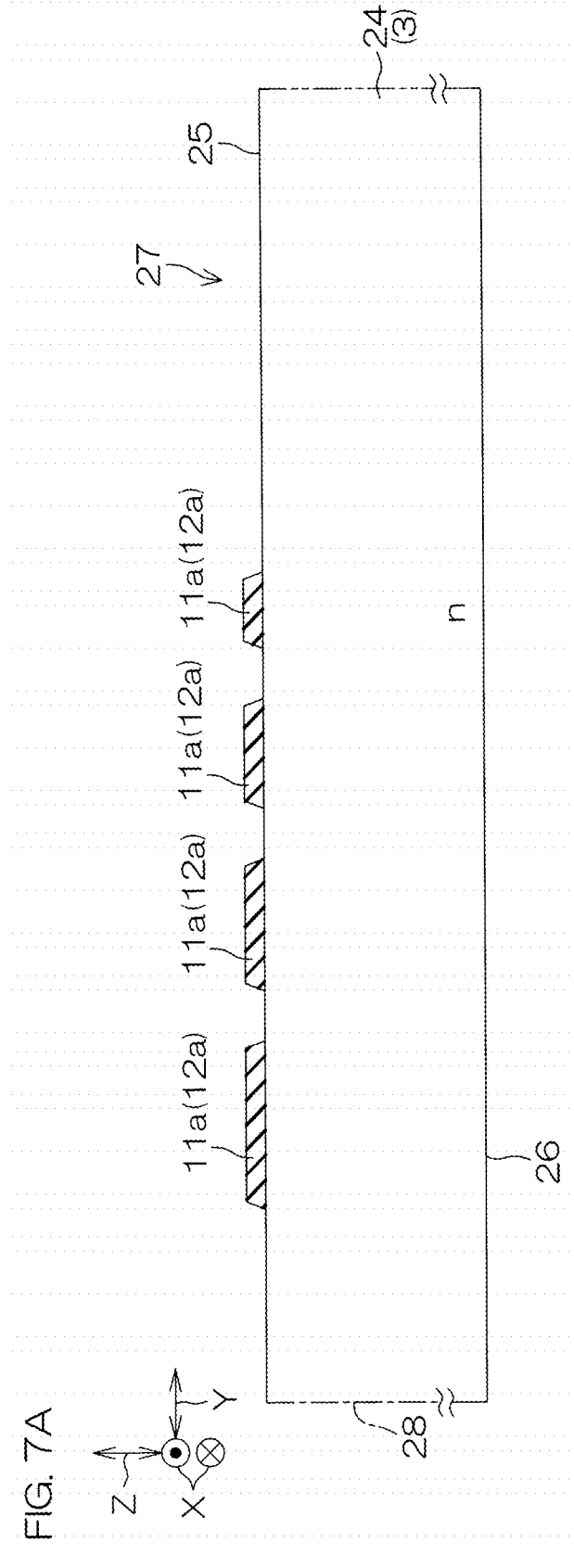
FIG. 7A is a sectional view of portions corresponding to those of FIG. 2 and a sectional view for describing one example of a method for manufacturing the semiconductor device shown in FIG. 1.

With reference to FIG. 7A, a semiconductor wafer 24 is provided. The semiconductor wafer 24 is constituted of an Si wafer. The semiconductor wafer 24 has a first wafer principal surface 25 on one side and a second wafer principal surface 26 on the other side. The semiconductor wafer 24 is a base member of the semiconductor chip 2 and has an n type semiconductor layer 3 over the entire region of the interior thereof. The first wafer principal surface 25 and the second wafer principal surface 26 of the semiconductor wafer 24 respectively correspond to the first principal surface 21 and the second principal surface 22 of the semiconductor chip 2 (semiconductor layer 3).

Next, a plurality of device regions 27 and a predetermined cutting line 28 for demarcating the plurality of device regions 27 are set in the semiconductor wafer 24. The plurality of device regions 27 are regions in which the semiconductor device 1 is formed in each of them and may be arranged in a matrix form in the first direction X and in the second direction Y in plan view. The predetermined cutting line 28 may be set in a lattice shape according to the arrangement of the plurality of device regions 27 in plan view. FIG. 7A to FIG. 7J each show a part of one device region 27 (portion on the outer region 5 side) and omit illustration of other regions.

Next, a first base insulating film 11a which serves as a base of the thick film portion 12a of the principal surface insulating film 12 is formed on the first wafer principal surface 25. The first base insulating film 11a may be formed by a CVD (Chemical Vapor Deposition) method and/or a thermal oxidation treatment method. In this preferred embodiment, the first base insulating film 11a is constituted of a thermal oxide film formed by the thermal oxidation treatment method. Next, an unnecessary portion of the first base insulating film 11a is removed by an etching method through a resist mask (not shown) having a predetermined pattern. Thereby, the thick film portion 12a of the principal surface insulating film 12 is formed on the first wafer principal surface 25.

Figure 7B:
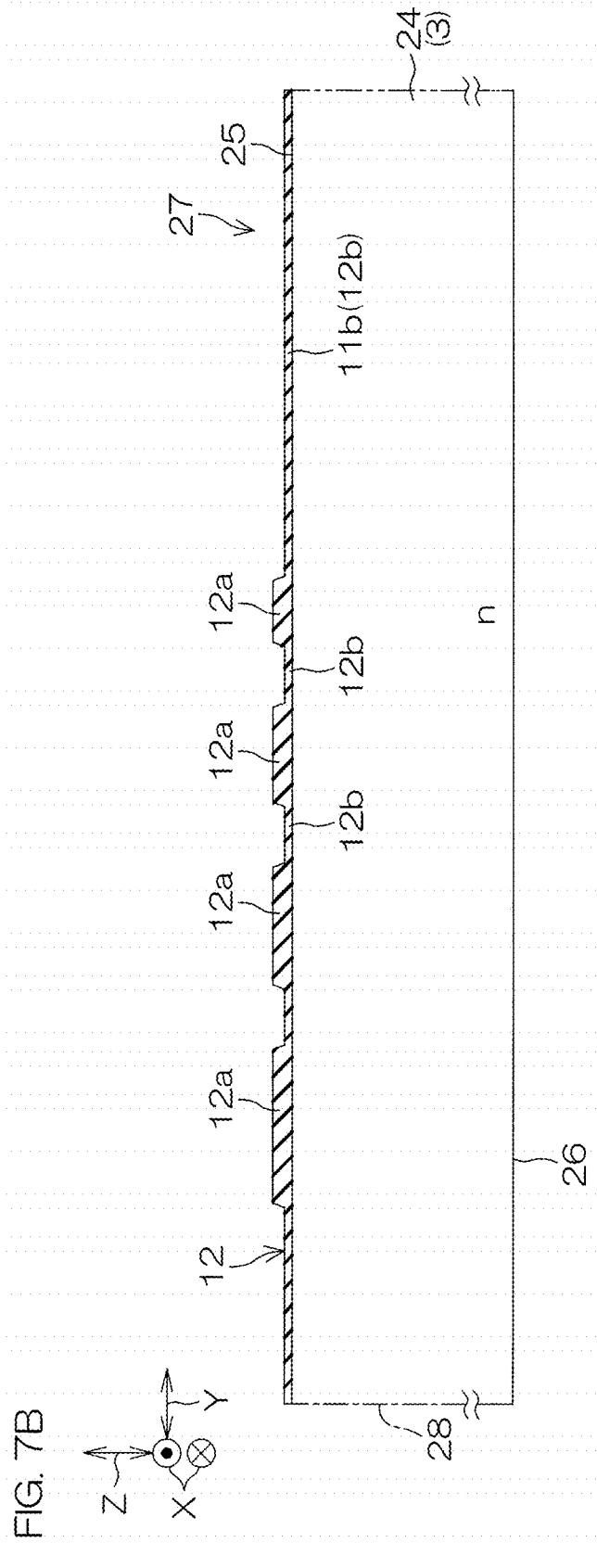
FIG. 7B is a sectional view for describing a step subsequent to that of FIG. 7A.

Next, with reference to FIG. 7B, a second base insulating film 11b which serves as a base of the thin film portion 12b of the principal surface insulating film 12 is formed on the first wafer principal surface 25. The second base insulating film 11b has a thickness less than a thickness of the first base insulating film 11a (thick film portion 12a). The second base insulating film 11b may be formed by a CVD method and/or a thermal oxidation treatment method. In this preferred embodiment, the second base insulating film 11b is constituted of a thermal oxide film formed by the thermal oxidation treatment method. Thereby, the principal surface insulating film 12 having the thick film portion 12a and the thin film portion 12b is formed.

Figure 7C:
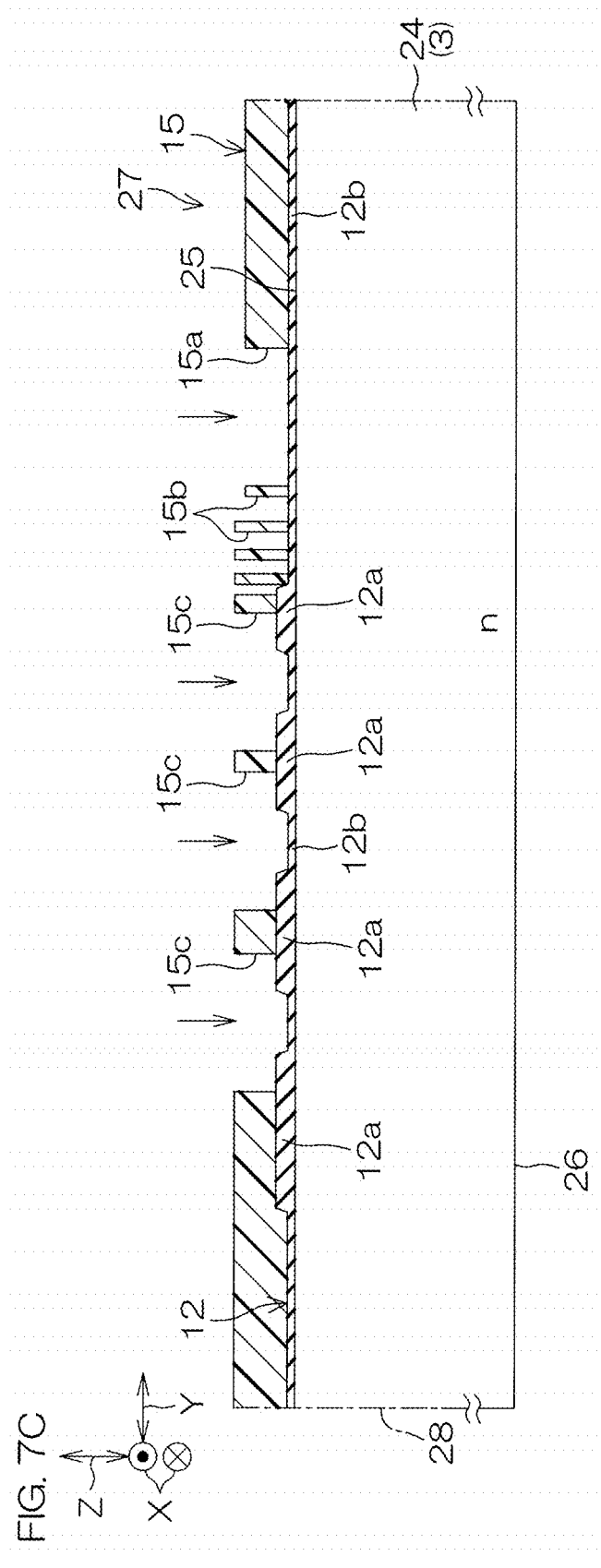
FIG. 7C is a sectional view for describing a step subsequent to that of FIG. 7B.

Next, with reference to FIG. 7C, regions which are to form the active region 4 and the outer region 5 are set on the first wafer principal surface 25, and the well region 7 is formed on the surface layer portion of the first wafer principal surface 25 so as to demarcate the active region 4 and the outer region 5. In this step, the FL regions 13A to 13C are formed together with the well region 7 on the surface layer portion of the first wafer principal surface 25. In this step, first, a resist mask 15 having a predetermined pattern is formed on the principal surface insulating film 12. The resist mask 15 has a first opening 15a for exposing a region of the first wafer principal surface 25 which is to form the high concentration portion 8 of the well region 7. The first opening 15a exposes an entire region of the region which is to form the high concentration portion 8.

Further, the resist mask 15 has a plurality of second openings 15b for exposing a region of the first wafer principal surface 25 which is to form the low concentration portion 9 of the well region 7. That is, the resist mask 15 partially exposes the region which is to form the low concentration portion 9 by the plurality of second openings 15b and also partially covers the region which is to form the low concentration portion 9 outside the plurality of second openings 15b.

Each of the plurality of second openings 15b has an opening area less than an opening area of the first opening 15a for the high concentration portion 8. A total opening area of the plurality of second openings 15b for the low concentration portion 9 is preferably less than the opening area of the first opening 15a for the high concentration portion 8. The plurality of second openings 15b may be formed in an annular shape or may be formed in a dot shape (for example, matrix shape or zigzag shape) so as to partially expose the region which is to form the low concentration portion 9. The plurality of second openings 15b are not necessarily required to have an equal opening width. The plurality of second openings 15b may be formed so that the opening width will become narrower sequentially, for example, from the active region 4 side to the outer region 5 side.

In addition, the resist mask 15 has a plurality of third openings 15c for respectively exposing regions of the first wafer principal surface 25 which are to form the plurality of FL regions 13A to 13C. The plurality of third openings 15c respectively expose entire regions of the regions which are to form the plurality of FL regions 13A to 13C. That is, the plurality of third openings 15c are formed in the same mode as the first opening 15a for the high concentration portion 8.

Figure 7D:
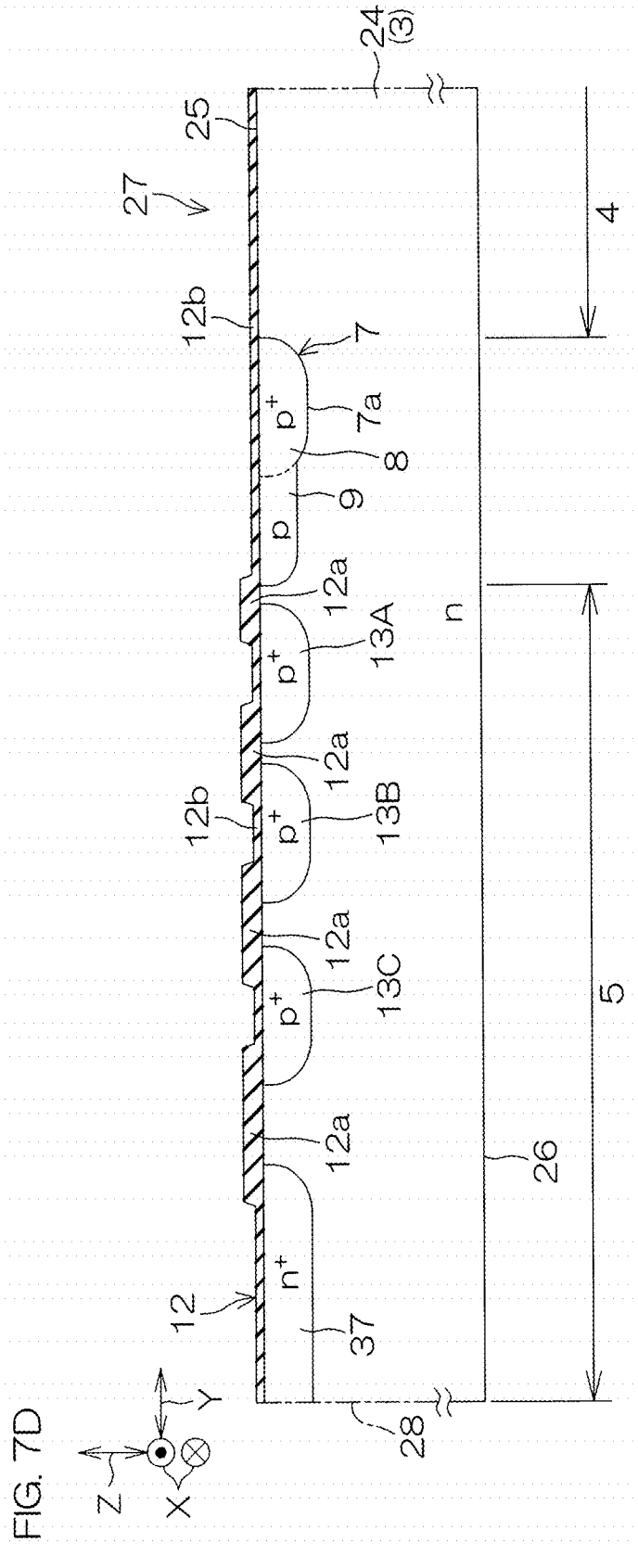
FIG. 7D is a sectional view for describing a step subsequent to that of FIG. 7C.

Next, with reference to FIG. 7D, a p type impurity (for example, boron) is introduced through the resist mask 15 into a surface layer portion of the first wafer principal surface 25. Specifically, the p type impurity is introduced into the surface layer portion of the first wafer principal surface 25 through the thin film portion 12*b* of the principal surface insulating film 12 which is exposed from the first opening 15*a*, the plurality of second openings 15*b* and the plurality of third openings 15*c*. The thin film portion 12*b* of the principal surface insulating film 12 protects the first wafer principal surface 25 from damage resulting from introduction of the p type impurity. Thereby, the well region 7 which includes the high concentration portion 8 and the low concentration portion 9 as well as the plurality of FL regions 13A to 13C are respectively formed on the surface layer portion of the first wafer principal surface 25. The well region 7 demarcates the active region 4 and the outer region 5 in each device region 27.

In this step, introduction of the p type impurity is partially blocked by the resist mask 15 in a region which is to form the low concentration portion 9. Therefore, an amount of the p type impurity introduced into the surface layer portion of the first wafer principal surface 25 through the plurality of second openings 15*b* is smaller than an amount of the p type impurity introduced into the surface layer portion of the first wafer principal surface 25 through the first opening 15*a*. Further, an amount of the p type impurity introduced into the low concentration portion 9 side is smaller than an amount of the p type impurity introduced into the high concentration portion 8 side and, therefore, the thickness of the low concentration portion 9 is less than the thickness of the high concentration portion 8. Thereby, the p type impurity introducing step is conducted once through one resist mask 15, by which it is possible to form at the same time the high concentration portion 8 and the low concentration portion 9, each of which has a p type impurity concentration different from each other.

On the other hand, on the FL regions 13A to 13C side, the p type impurity is introduced through the third opening 15*c* similar to the first opening 15*a*. Therefore, the p type impurity concentration and the thickness of the FL regions 13A to 13C are substantially similar respective to the p type impurity concentration and the thickness of the high concentration portion 8. The resist mask 15 is removed after formation of the well region 7 and the plurality of FL regions 13A to 13C.

In this step, a description has been given of an example in which the FL regions 13A to 13C are formed at the same time with the well region 7. However, a step of forming the FL regions 13A to 13C can be executed at any given timing and the step is not necessarily required to be executed at this timing. The step of forming the FL regions 13A to 13C may be executed prior to a step of forming the well region 7 or may be executed after the step of forming the well region 7.

Next, the channel stop region 37 is formed outside the FL regions 13A to 13C on the surface layer portion of the first wafer principal surface 25. The channel stop region 37 is formed along the predetermined cutting line 28. The channel stop region 37 is formed by introducing the n type impurity into the surface layer portion of the first wafer principal surface 25 through a resist mask (not shown). Thereafter, the resist mask (not shown) for the channel stop region 37 is removed. A step of forming the channel stop region 37 can be executed at any given timing and not necessarily executed at this timing. The step of forming the channel stop region 37 may be executed prior to the step of forming the well region 7.

Figure 7E:
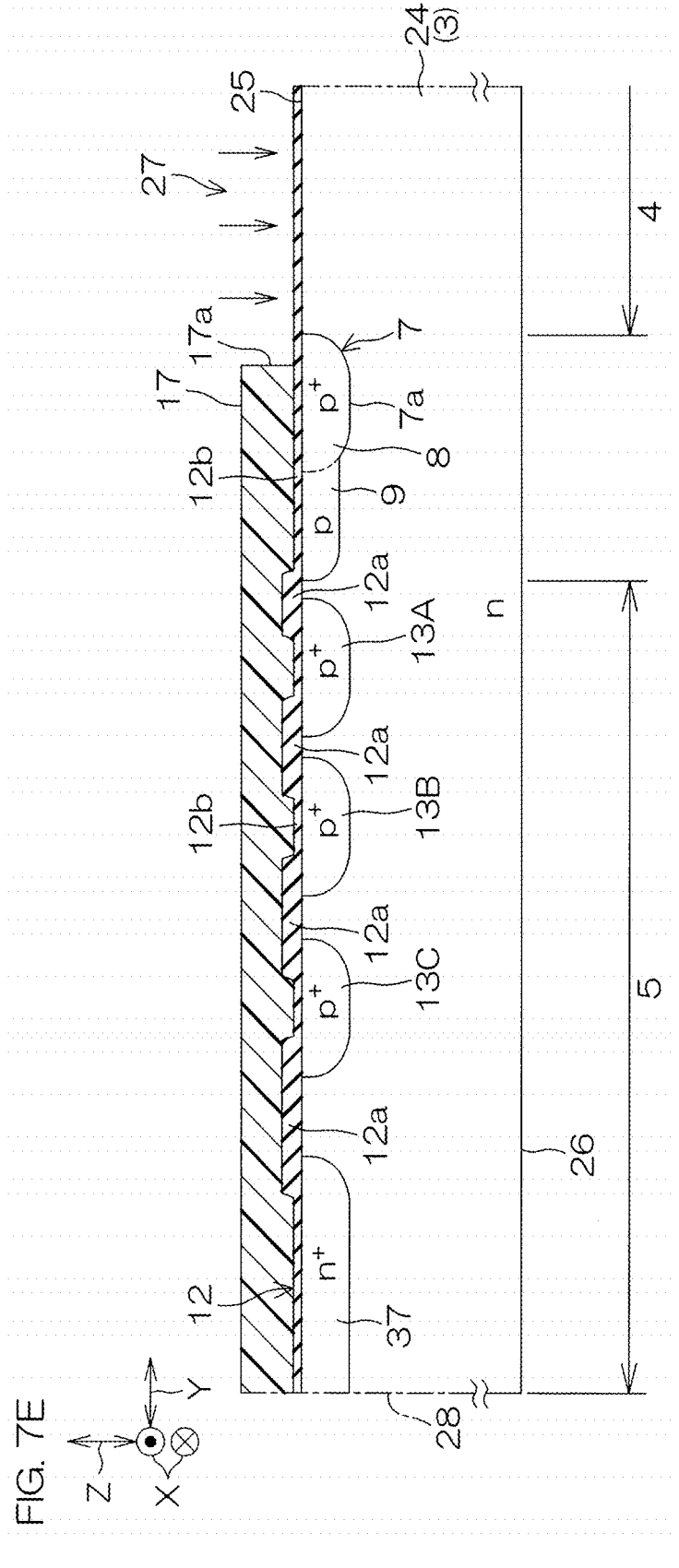
FIG. 7E is a sectional view for describing a step subsequent to that of FIG. 7D.

Next, with reference to FIG. 7E, a resist mask 17 having a predetermined pattern is formed on the principal surface insulating film 12. The resist mask 17 has an opening 17*a* for exposing a region of the first wafer principal surface 25 which is to form the impurity region 6.

Figure 7F:
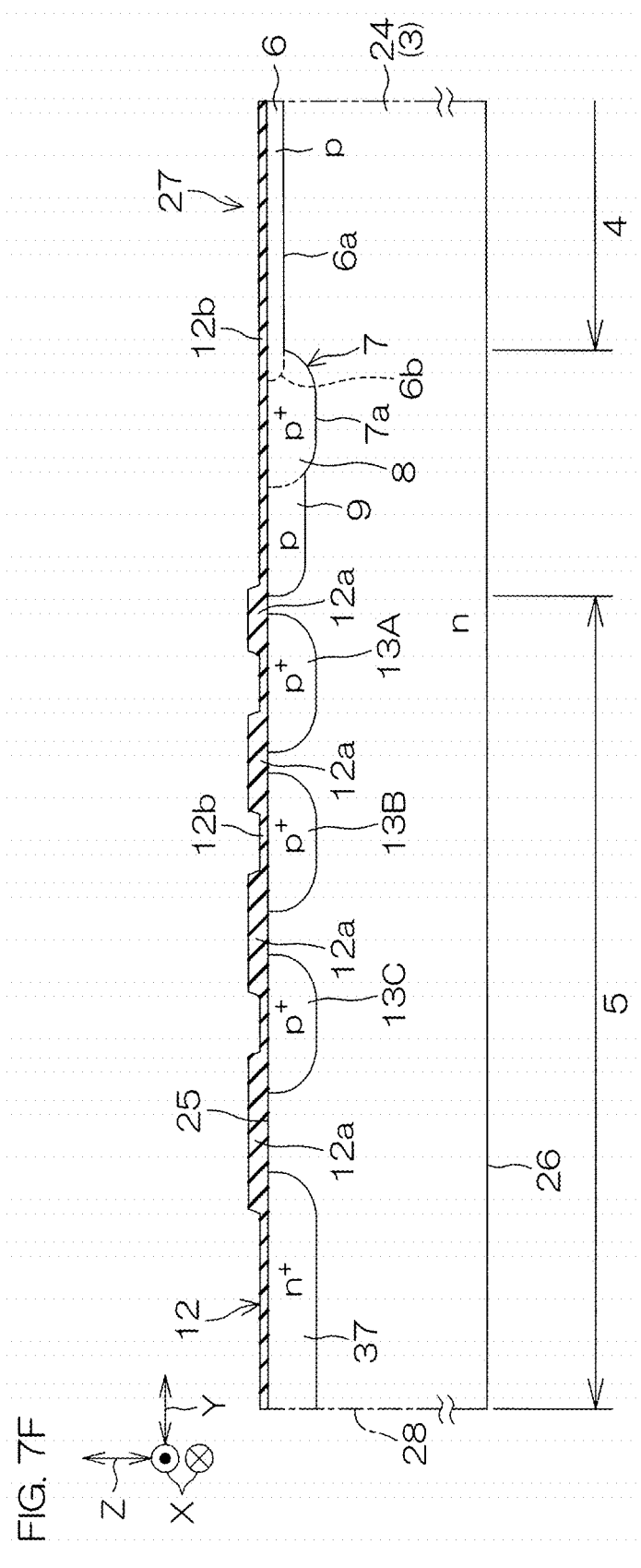
FIG. 7F is a sectional view for describing a step subsequent to that of FIG. 7E.

Next, with reference to FIG. 7F, the p type impurity is introduced into the surface layer portion of the first wafer principal surface 25 through the resist mask 17. The impurity region 6 is, thereby, formed. The resist mask 17 is, thereafter, removed. A step of forming the impurity region 6 can be executed at any given timing and not necessarily required to be executed at this timing. The step of forming the impurity region 6 may be executed prior to the step of forming the channel stop region 37 or may be executed prior to the step of forming the well region 7.

Figure 7G:
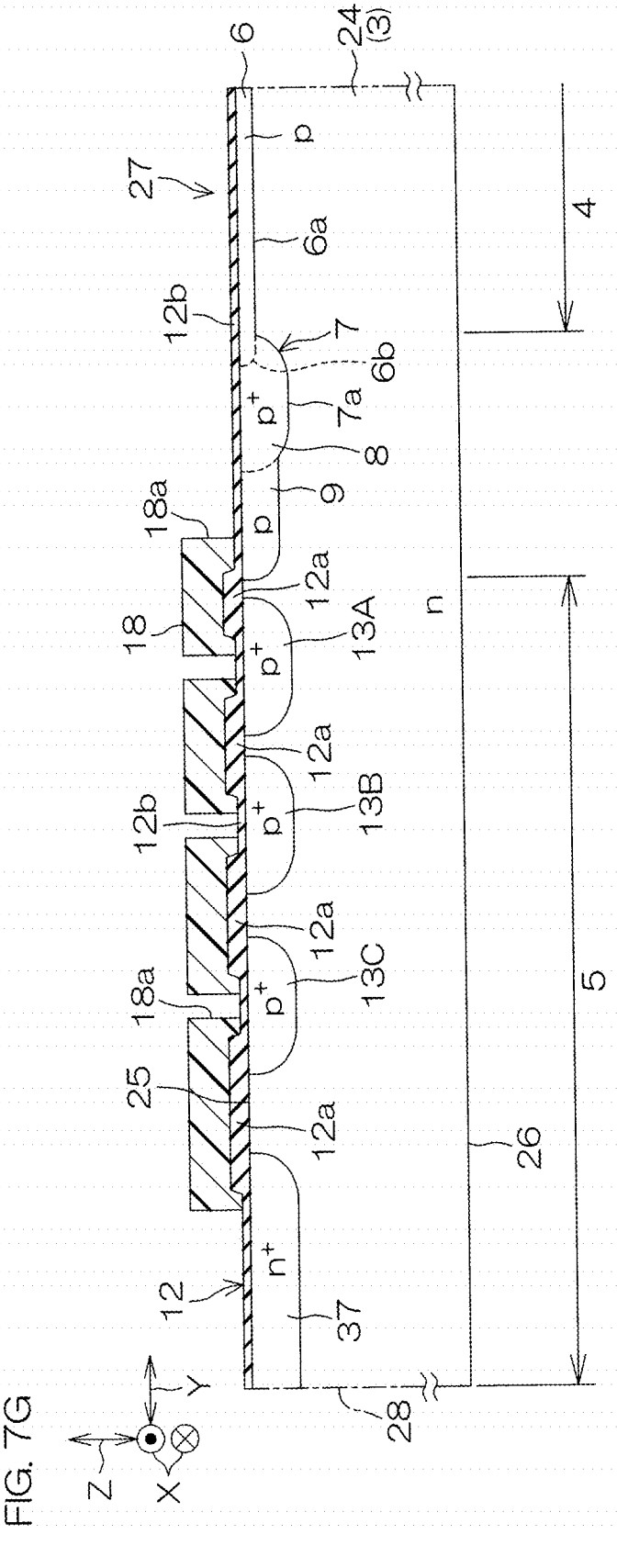
FIG. 7G is a sectional view for describing a step subsequent to that of FIG. 7F.

Next, with reference to FIG. 7G, a resist mask 18 having a predetermined pattern is formed on the principal surface insulating film 12. The resist mask 18 has a plurality of openings 18*a* for exposing a region of the principal surface insulating film 12 which is to form the first opening 12*e*, the plurality of second openings 39*a* and the third opening 12*d*. In this preferred embodiment, the plurality of openings 18*a* each expose the thin film portion 12*b* of the principal surface insulating film 12.

Figure 7H:
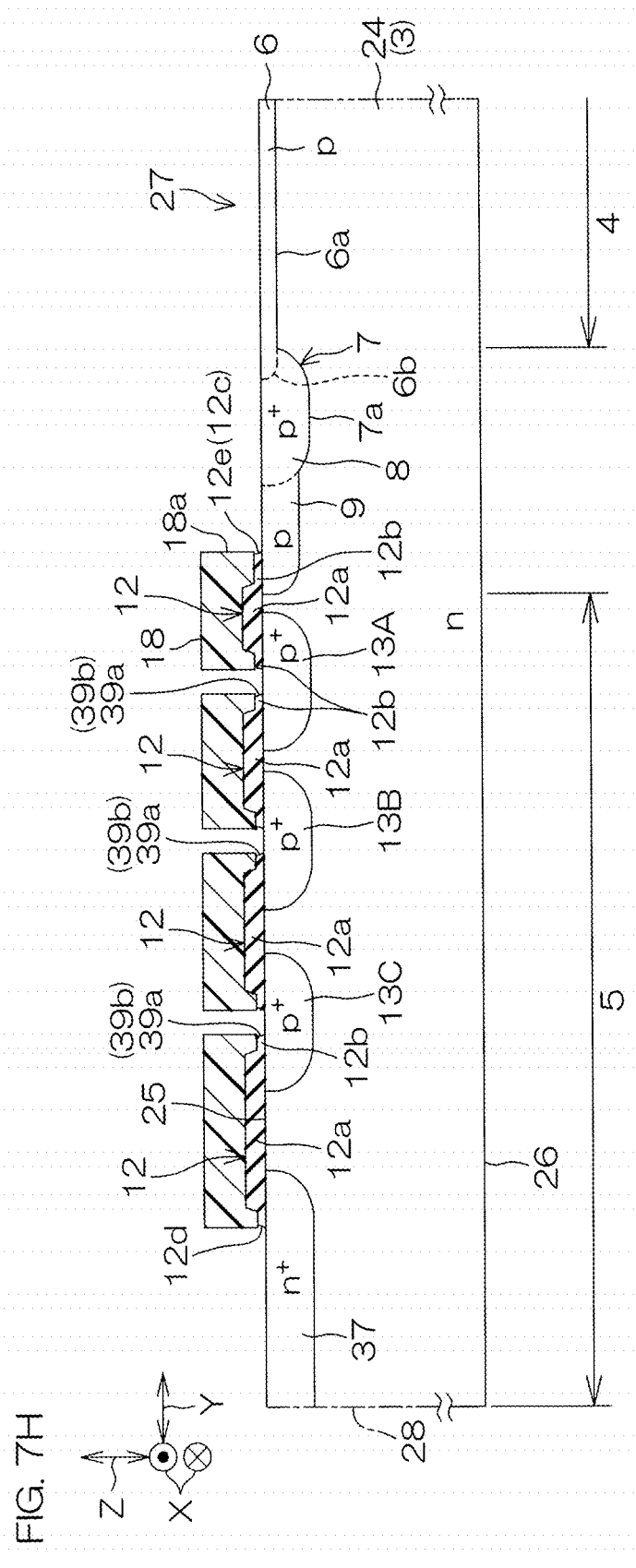
FIG. 7H is a sectional view for describing a step subsequent to that of FIG. 7G.
Figure 7:
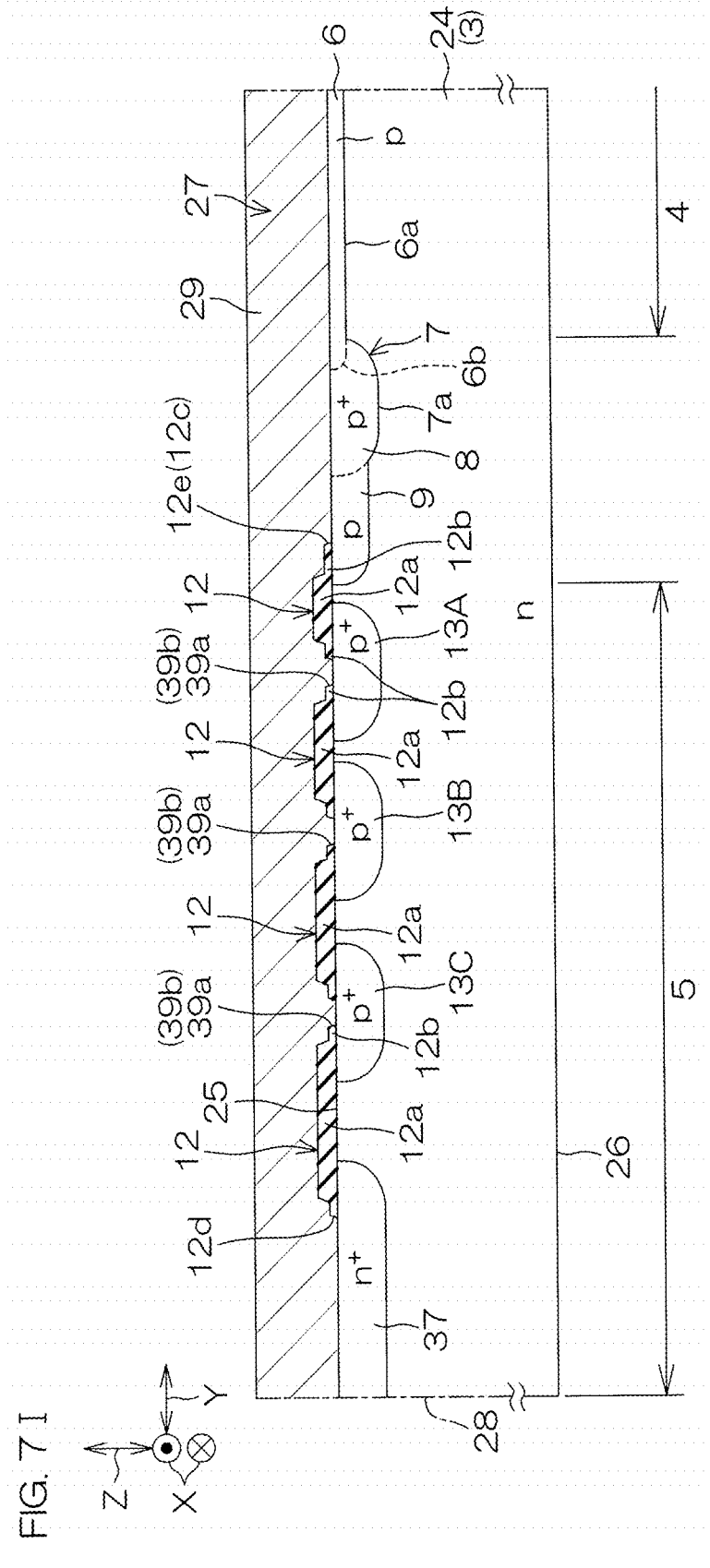
FIG. 7I is a sectional view for describing a step subsequent to that of FIG. 7H.
FIG. 7J is a sectional view for describing a step subsequent to that of FIG. 7I.

Next, with reference to FIG. 7H, an unnecessary portion of the principal surface insulating film 12 is removed by an etching method through the resist mask 18. The etching method may be a wet etching method and/or a dry etching method. Thereby, the first opening 12*e*, the plurality of second openings 39*a* and the third opening 12*d* are formed on the principal surface insulating film 12. The resist mask 18 is, thereafter, removed.

Next, with reference to FIG. 7I, a base electrode layer 29 which serves as a base of the first principal surface electrode 36, those of the plurality of field electrodes 41 and that of the equipotential electrode 42 is formed on the first wafer principal surface 25. The base electrode layer 29 may have a laminated structure which includes a Ti-based metal film and an Al-based metal film laminated in this order from the first wafer principal surface 25 side. The Ti-based metal film may include at least one of a Ti film and a TiN film. The Al-based metal film may include at least one of a pure Al film (Al film with purity of not less than 99%), an AlCu alloy film, an AlSi alloy film and an AlSiCu alloy film. The base electrode layer 29 (Ti-based metal film and the Al-based metal film) may be formed by a sputtering method and/or a vapor deposition method.

Figure 7J:
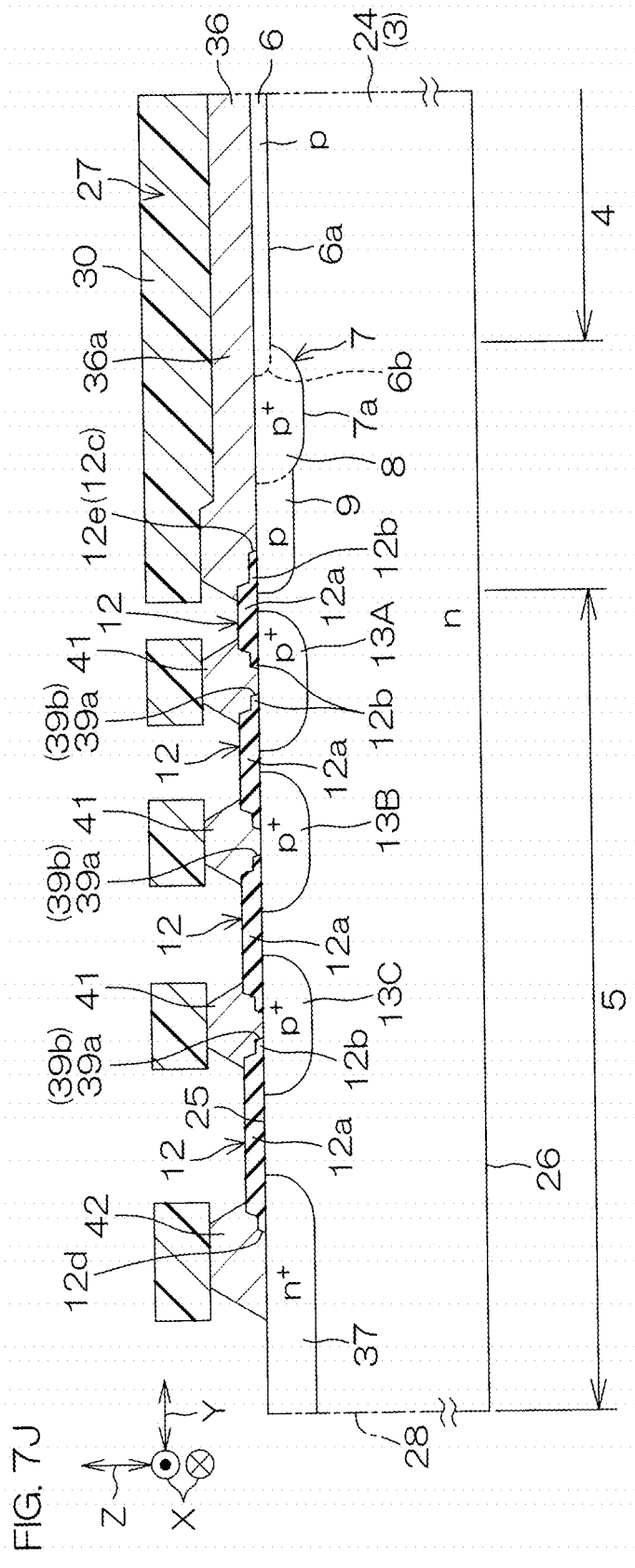

Next, with reference to FIG. 7J, a resist mask 30 having a predetermined pattern is formed on the base electrode layer 29. The resist mask 30 covers a region of the base electrode layer 29 which is to form the first principal surface electrode 36, the plurality of field electrodes 41 and the equipotential electrode 42 and exposes the other regions.

Next, an unnecessary portion of the base electrode layer 29 is removed by an etching method through the resist mask 30. The etching method may be a wet etching method and/or a dry etching method. Thereby, the first principal surface electrode 36, the plurality of field electrodes 41 and the equipotential electrode 42 are formed. The resist mask 30 is, thereafter, removed.

Next, an organic insulating film 35 is coated on the first wafer principal surface 25 so as to cover the first principal surface electrode 36, the plurality of field electrodes 41 and the equipotential electrode 42. Next, the organic insulating film 35 is selectively exposed and developed. Thereby, a pad opening 35*a* for exposing a position of the first principal surface electrode 36 is formed in the organic insulating film 35. Next, the second principal surface electrode 33 is formed on the second wafer principal surface 26. The second principal surface electrode 33 may include a Ti film. The second principal surface electrode 33 may be formed by a sputtering method and/or a vapor deposition method.

Thereafter, the semiconductor wafer 24 is cut along the predetermined cutting line 28. Thereby, the plurality of device regions 27 are each cut out as the semiconductor device 1. The semiconductor device 1 is manufactured by the steps as described above.

Figure 8:
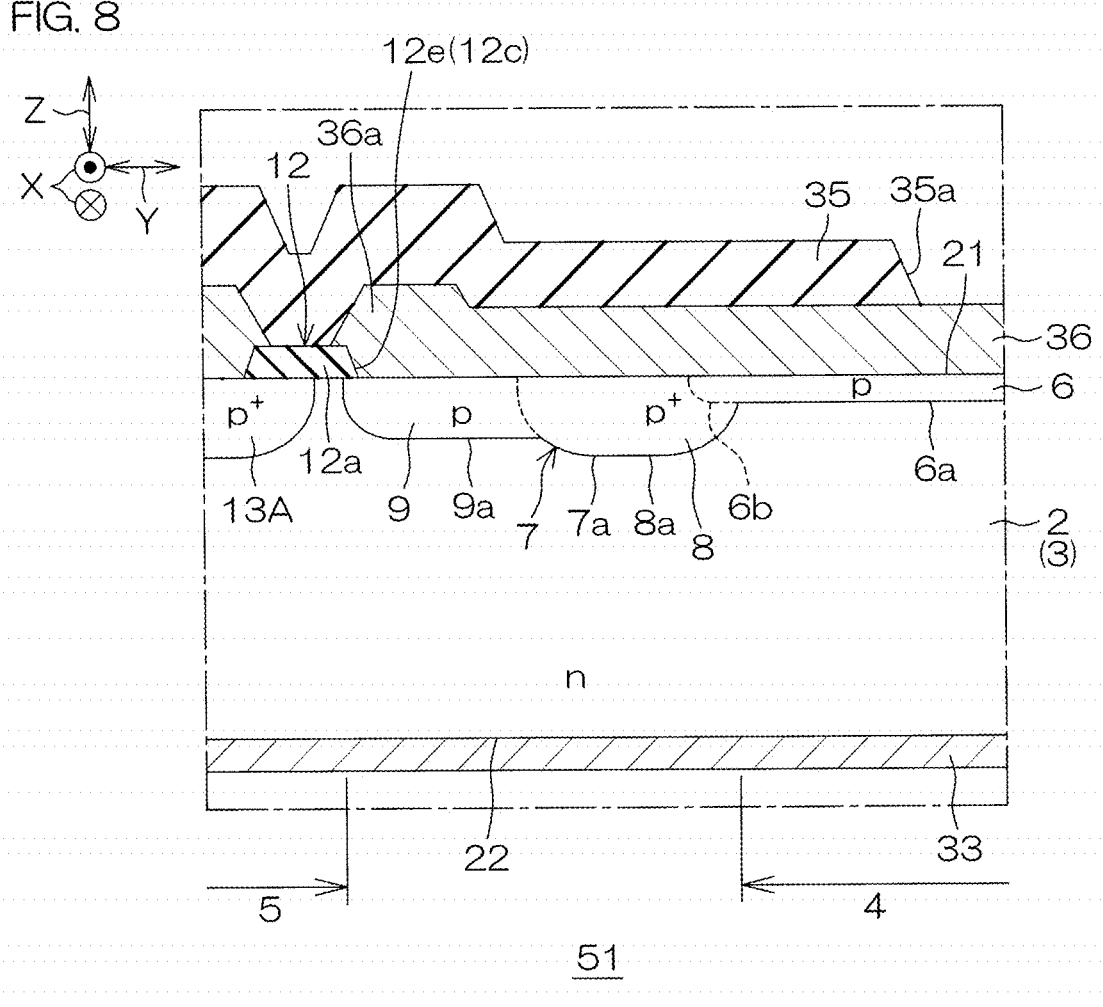
FIG. 8 is a sectional view corresponding to FIG. 3 and shows a semiconductor device according to a second preferred embodiment of the present disclosure.

FIG. 8 is a sectional view corresponding to FIG. 3 and shows a semiconductor device 51 according to a second preferred embodiment of the present disclosure. In the following, structures corresponding to the structures described in the semiconductor device 1 will be given the same reference signs and a description thereof will be omitted.

In the semiconductor device 1, the first opening 12*e* is demarcated by the thin film portion 12*b* of the principal surface insulating film 12. In contrast thereto, in the semiconductor device 51, a first opening 12*e* is demarcated by a thick film portion 12*a* of a principal surface insulating film 12. A wall portion 12*c* of the first opening 12*e* is positioned on a well region 7. Thereby, the first opening 12*e* exposes a part of an impurity region 6 and that of the well region 7. The wall portion 12*c* of the first opening 12*e* is positioned on a low concentration portion 9 of the well region 7 and formed in a quadrilateral shape extending along the low concentration portion 9 in plan view.

That is, the first opening 12*e* exposes an entire region of the impurity region 6, an entire region of a high concentration portion 8 and a part of the low concentration portion 9. A plane area of a portion of the low concentration portion 9 which is exposed from the principal surface insulating film 12 preferably exceeds a plane area of a portion of the low concentration portion 9 which is covered by the principal surface insulating film 12. In this preferred embodiment, a lead-out portion 36*a* of a first principal surface electrode 36 opposes the low concentration portion 9 of the well region 7 across the thick film portion 12*a* of the principal surface insulating film 12.

Although illustration is omitted, a plurality of second openings 39*a* for FL regions 13A to 13C may be formed in the thick film portion 12*a* of the principal surface insulating film 12, as with the first opening 12*e*. Further, a third opening 12*d* for a channel stop region 37 may be formed in the thick film portion 12*a* of the principal surface insulating film 12, as with the first opening 12*e*. That is, the principal surface insulating film 12 according to the semiconductor device 51 may be free of the thin film portion 12*b* and constituted only of the thick film portion 12*a*. The above-described principal surface insulating film 12 is formed by removing all of the thin film portion 12*b* in a step in FIG. 7H.

As described so far, the semiconductor device 51 is also able to provide the same effects as those described in the semiconductor device 1.

Figure 9:
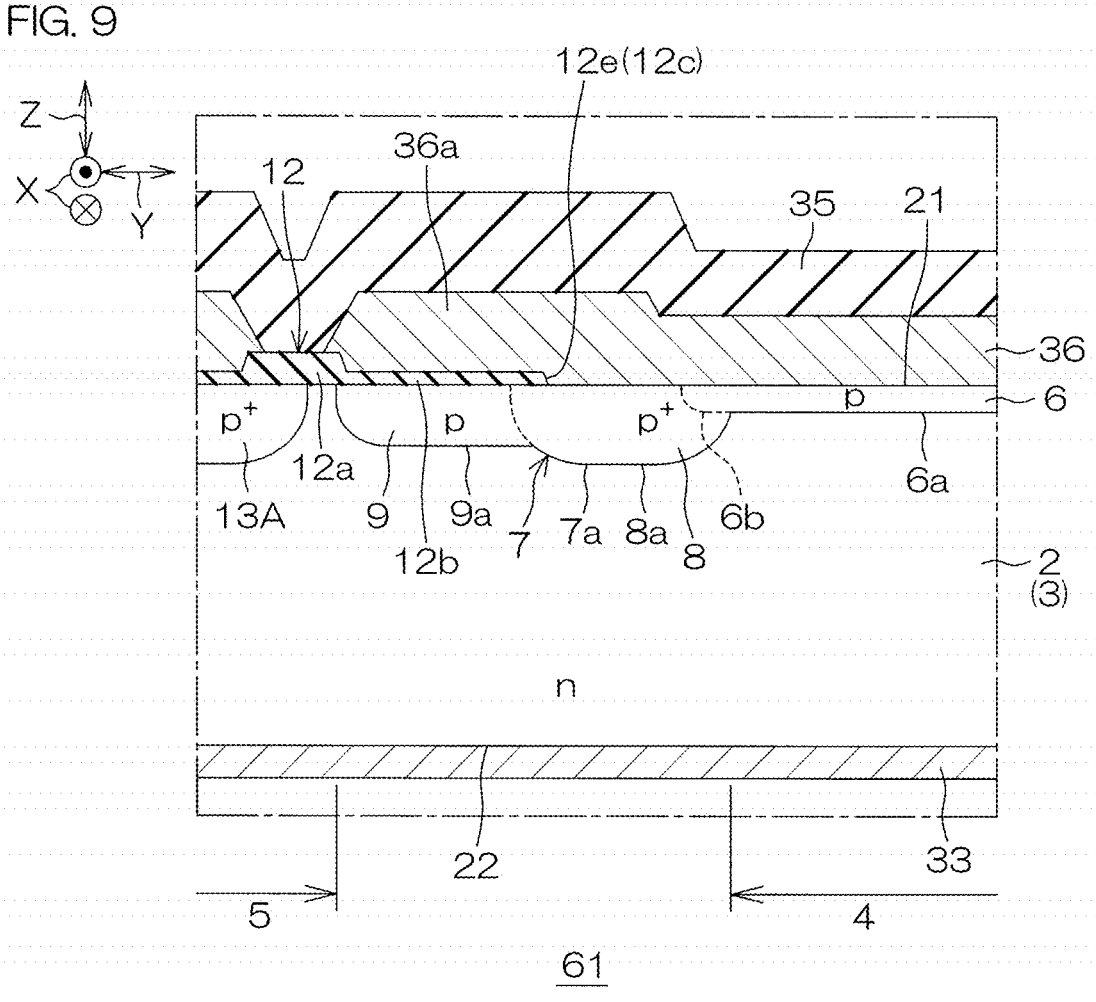
FIG. 9 is a sectional view corresponding to FIG. 3 and shows a semiconductor device according to a third preferred embodiment of the present disclosure.

FIG. 9 is a sectional view corresponding to FIG. 3 and shows a semiconductor device 61 according to a third preferred embodiment of the present disclosure. In the following, structures corresponding to the structures described in the semiconductor device 1 will be given the same reference signs, and a description thereof will be omitted.

In the semiconductor device 1, the wall portion 12*c* of the first opening 12*e* is formed on the low concentration portion 9. In contrast thereto, with reference to FIG. 9, in the semiconductor device 61, a wall portion 12*c* of a first opening 12*e* is formed on a high concentration portion 8. That is, a principal surface insulating film 12 covers an entire region of a low concentration portion 9 and exposes an entire region of an impurity region 6 and a part of the high concentration portion 8. In this preferred embodiment, the first opening 12*e* is formed in a thin film portion 12*b* of the principal surface insulating film 12.

A first principal surface electrode 36 is led out onto the high concentration portion 8 of a well region 7 from above the impurity region 6 and connected to the impurity region 6 and the high concentration portion 8. A lead-out portion 36*a* of the first principal surface electrode 36 is led out onto the principal surface insulating film 12 from above the high concentration portion 8. In this preferred embodiment, the lead-out portion 36*a* opposes a part of the high concentration portion 8 and an entire region of the low concentration portion 9 across the principal surface insulating film 12. The semiconductor device 61 is manufactured by changing a layout of a resist mask in the method for manufacturing the semiconductor device 1.

As described so far, the low concentration portion 9 is not connected to the first principal surface electrode 36 and, therefore, the semiconductor device 61 fails in providing the recovery current discharging effects by both the high concentration portion 8 and the low concentration portion 9. However, except for the above, it is able to provide the same effects as those described in the semiconductor device 1. In the semiconductor device 61, a description has been given of an example in which the first opening 12*e* is formed in the thin film portion 12*b* of the principal surface insulating film 12. However, like the semiconductor device 51 according to the second preferred embodiment, the first opening 12*e* may be formed in the thick film portion 12*a* of the principal surface insulating film 12.

Figure 10:
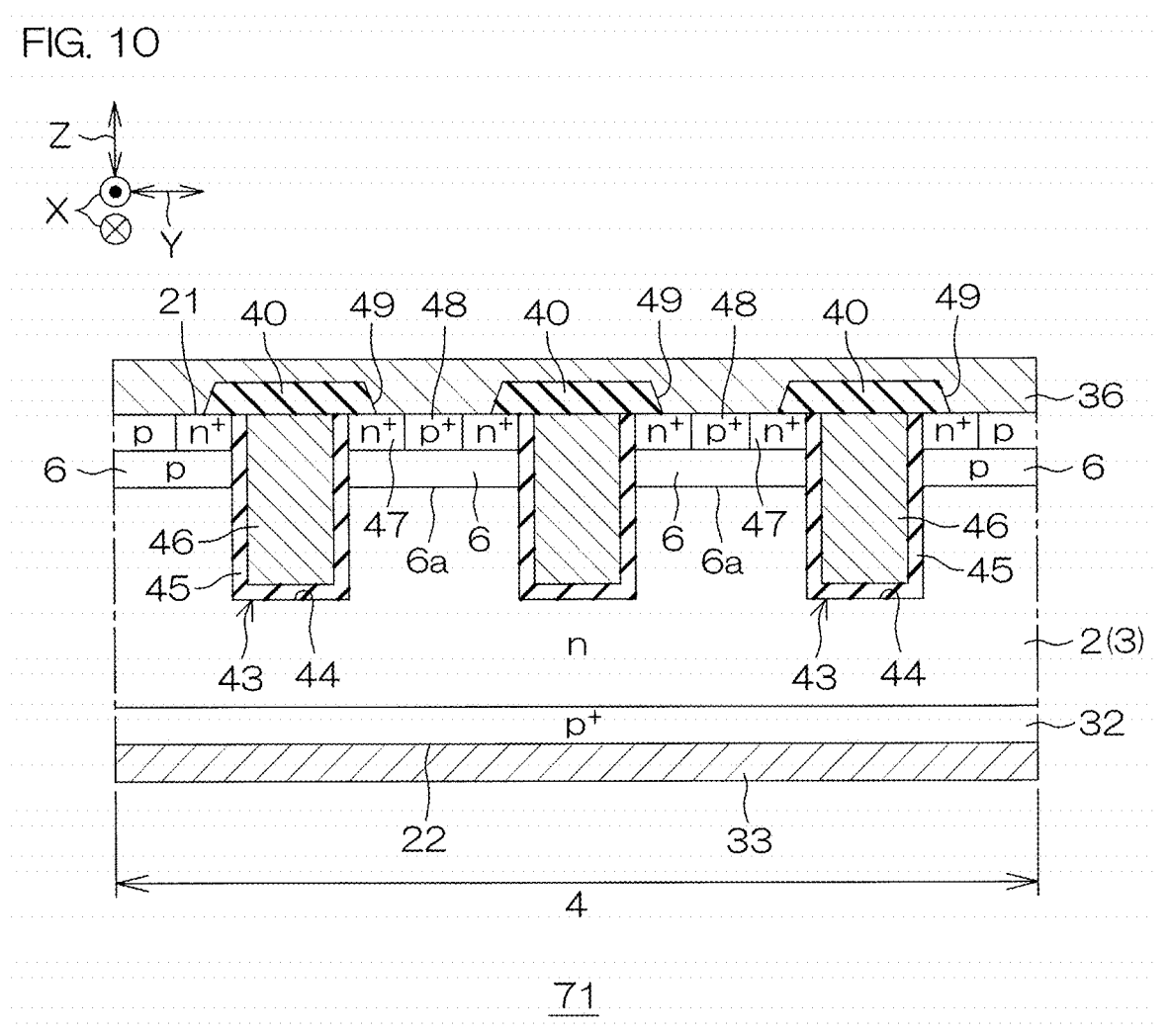

FIG. 10 is an enlarged sectional view showing an active region 4 of a semiconductor device 71 according to a fourth preferred embodiment of the present disclosure. In the following, structures corresponding to the structures described in the semiconductor device 1 will be given the same reference signs, and a description thereof will be omitted.

In each of the previously described preferred embodiments, a description has been given of an example in which the pn junction diode, as an example of the functional device, is formed in the active region 4. However, any given functional device may be formed in the active region 4 and shall not be limited to the pn junction diode. The semiconductor device 71 is constituted of a semiconductor switching device which includes, in the active region 4, an IGBT (Insulated Gate Bipolar Transistor) in place of the pn junction diode.

With reference to FIG. 10, the semiconductor device 71 includes the previously described semiconductor layer 3 formed in a semiconductor chip 2. The semiconductor layer 3 is formed in the same mode as that of the first preferred embodiment. In this preferred embodiment, the semiconductor layer 3 is formed as a drift layer of the IGBT. Further, the semiconductor device 71 includes, in the active region 4, the previously described impurity region 6 formed on a surface layer portion of a first principal surface 21. The impurity region 6 is formed in the same mode as that of the first preferred embodiment. In this preferred embodiment, the impurity region 6 is formed as a base region of the IGBT.

The semiconductor device 71 includes a p type collector region 32 which is formed on a surface layer portion of a second principal surface 22 of the semiconductor layer 3. The collector region 32 forms a collector of the IGBT. The collector region 32 is formed over the entire region of the surface layer portion of the second principal surface 22 and exposed from the second principal surface 22.

The semiconductor device 71 includes, in the active region 4, a plurality of trench gate structures 43 formed in the first principal surface 21. The plurality of trench gate structures 43 form a gate of the IGBT. The plurality of trench gate structures 43 may each extend in the first direction X and may be formed at intervals in the second direction Y in plan view. That is, the plurality of trench gate structures 43 may be formed, as a whole, in a stripe shape extending in the first direction X in plan view.

The plurality of trench gate structures 43 are each formed in the first principal surface 21 so as to penetrate through the impurity region 6 and reach the semiconductor layer 3. The plurality of trench gate structures 43 each include a trench 44, a gate insulating film 45 and a gate electrode 46. The gate insulating film 45 is formed in a film shape along a wall surface of the trench 44. The gate electrode 46 is embedded into the trench 44 across the gate insulating film 45. The gate electrode 46 opposes the semiconductor layer 3 and the impurity region 6 across the gate insulating film 45.

The semiconductor device 71 includes, on the side of the plurality of trench gate structures 43, a plurality of emitter regions 47 each of which is formed on the surface layer portion of the first principal surface 21. The plurality of emitter regions 47 form an emitter of the IGBT. Each of the emitter regions 47 has an n type impurity concentration exceeding an n type impurity concentration of the semiconductor layer 3. Each of the emitter regions 47 is formed at intervals from a bottom portion 6a of the impurity region 6 to the first principal surface 21 side, thereby forming a channel of the IGBT with the semiconductor layer 3.

The semiconductor device 71 includes a plurality of p type contact regions 48, each of which is formed in a region between two neighboring trench gate structures 43 on the surface layer portion of the first principal surface 21. Each of the contact regions 48 has a p type impurity concentration exceeding a p type impurity concentration of the impurity region 6. Each of the contact regions is formed in a central portion of two neighboring trench gate structures 43 and electrically connected to the impurity region 6 and each of the emitter regions 47.

The semiconductor device 71 includes, in the active region 4, an interlayer insulating film 40 which is formed on the first principal surface 21. The interlayer insulating film 40 may include an SiO2 film. The interlayer insulating film 40 covers the plurality of trench gate structures 43. The interlayer insulating film 40 has a plurality of emitter openings 49. Each of the emitter openings 49 is formed in a region between two neighboring trench gate structures 43 in plan view to respectively expose the emitter region 47 and the contact region 48.

The semiconductor device 71 includes, in the active region 4, the previously described first principal surface electrode 36 which is formed on the first principal surface 21. In this preferred embodiment, the first principal surface electrode 36 is constituted of an emitter electrode of the IGBT. The first principal surface electrode 36 enters into the plurality of emitter openings 49 from above the interlayer insulating film 40. The first principal surface electrode 36 is connected to the emitter region 47 and the contact region 48 inside the plurality of emitter openings 49.

The semiconductor device 71 includes the previously described second principal surface electrode 33 which covers the second principal surface 22 of the semiconductor layer 3. In this preferred embodiment, the second principal surface electrode 33 is constituted of a collector electrode of the IGBT. The second principal surface electrode 33 forms an ohmic contact with the second principal surface 22 (collector region 32).

As described so far, like the semiconductor device 71, even in a case where the IGBT is formed in the active region 4 in place of the pn junction diode, the same effects as those of the semiconductor device 1 can be obtained. A structure in which the IGBT is formed in the active region 4 can be applied not only to the first preferred embodiment but also to the second to third preferred embodiments.

The present disclosure can also be executed by other embodiments.

In each of the previously described preferred embodiments, a description has been given of an example in which the first conductive type is an n type and the second conductive type is a p type. However, the first conductive type may be a p type and the second conductive type may be an n type. A specific constitution of this case can be obtained by replacing an n type region with a p type region and replacing a p type region with an n type region in the previous description and the accompanying drawings.

In the previously described fourth preferred embodiment, in place of the p type collector region 32, the n type drain region may be formed. According to this structure, in place of the IGBT, a MISFET (Metal Insulator Semiconductor Field Effect Transistor) can be provided. A specific constitution of this case can be obtained by replacing the "impurity region 6 (base region)" of the IGBT with the "impurity region 6 (body region)" of the MISFET, replacing the "emitter" of the IGBT with the "source" of the MISFET and placing the "collector" of the IGBT with the "drain" of the MISFET in the previous description. In this case, in the semiconductor chip 2, the drain region may be formed with a semiconductor substrate (Si substrate) and the semiconductor layer 3 may be formed with an epitaxial layer (Si epitaxial layer).

Hereinafter, examples of features extracted from the present description and drawings are indicated below. In the following, [Appendix 1] to [Appendix 20] provide a method for manufacturing a semiconductor device.

[Appendix 1] A method for manufacturing a semiconductor device (1, 51, 61, 71) including a step which provides a first conductive type semiconductor wafer (3, 24) having a principal surface (25), a step in which a region which is to form an active region (4) and an outer region (5) is set on the principal surface (25), a second conductive type impurity is selectively introduced into a surface layer portion of the principal surface (25), thereby demarcating the active region (4) and the outer region (5), and there is formed a second conductive type well region (7) which includes a first concentration portion (8) high in impurity concentration on the active region (4) side and a second concentration portion (9) lower in impurity concentration than the first concentration portion (8) on the outer region (5) side, and a step in which a second conductive type impurity is introduced into a surface layer portion of the principal surface (25) in the active region (4), thereby forming a second conductive type impurity region (6).

[Appendix 2] The method for manufacturing the semiconductor device (1, 51, 61, 71) according to Appendix 1, where an amount of the second conductive type impurity introduced into a region which is to form the second concentration portion (9) is less than an amount of the second conductive type impurity introduced into a region which is to form the first concentration portion (8).

[Appendix 3] The method for manufacturing the semiconductor device (1, 51, 61, 71) according to Appendix 1 or 2, where a step of forming the well region (7) includes a step in which a second conductive type impurity is introduced into a surface layer portion of the principal surface (25) through a mask having a first opening (15a) for exposing an entire region of a region of the semiconductor wafer (3, 24) which is to form the first concentration portion (8) and a second opening (15b) for partially exposing a region of the semiconductor wafer (3, 24) which is to form the second concentration portion (9).

[Appendix 4] The method for manufacturing the semiconductor device (1, 51, 61, 71) according to any one of Appendices 1 to 3, where the second concentration portion (9) has a concentration gradient in which an impurity concentration is gradually decreased from the principal surface (25) toward a thickness direction.

[Appendix 5] The method for manufacturing the semiconductor device (1, 51, 61, 71) according to any one of Appendices 1 to 4, where the first concentration portion (8) has a concentration gradient in which an impurity concentration is gradually decreased from the principal surface (25) toward a thickness direction.

[Appendix 6] The method for manufacturing the semiconductor device (1, 51, 61, 71) according to any one of Appendices 1 to 5, where the second concentration portion (9) has a thickness less than a thickness of the first concentration portion (8).

[Appendix 7] The method for manufacturing the semiconductor device (1, 51, 61, 71) according to any one of Appendices 1 to 6, where the well region (7) has a bottom portion (7a) which is recessed from a bottom portion (8a) of the first concentration portion (8) to a bottom portion (9a) of the second concentration portion (9).

[Appendix 8] The method for manufacturing the semiconductor device (1, 51, 61, 71) according to any one of Appendices 1 to 7, where the impurity region (6) has an impurity concentration less than an impurity concentration of the first concentration portion (8).

[Appendix 9] The method for manufacturing the semiconductor device (1, 51, 61, 71) according to any one of Appendices 1 to 8, where the impurity region (6) is connected to the first concentration portion (8).

[Appendix 10] The method for manufacturing the semiconductor device (1, 51, 61, 71) according to any one of Appendices 1 to 9, where the well region (7) is formed in an annular shape which surrounds the active region (4) in plan view.

[Appendix 11] The method for manufacturing the semiconductor device (1, 51, 61, 71) according to Appendix 10, where the first concentration portion (8) is formed in an annular shape which surrounds an internal portion of the semiconductor wafer (3, 24) in plan view and the second concentration portion (9) is formed in an annular shape which surrounds the first concentration portion (8) in plan view.

[Appendix 12] The method for manufacturing the semiconductor device (1, 51, 61, 71) according to any one of Appendices 1 to 11 further including a step which forms a principal surface insulating film (12) for covering the principal surface (25), a step which removes an unnecessary portion of the principal surface insulating film (12) to expose the impurity region (6) and the first concentration portion (8) from the principal surface insulating film (12), and a step which forms a principal surface electrode (36) which is electrically connected to the impurity region (6) and the first concentration portion (8) on the principal surface (25).

[Appendix 13] The method for manufacturing the semiconductor device (1, 51, 61, 71) according to any one of Appendices 1 to 12, where the step of removing the principal surface insulating film (12) includes a step of exposing the second concentration portion (9) from the principal surface insulating film (12), and the step of forming the principal surface electrode (36) includes a step of forming the principal surface electrode (36) which is electrically connected to the second concentration portion (9).

[Appendix 14] The method for manufacturing the semiconductor device (1, 51, 61, 71) according to any one of Appendices 1 to 13 further including a step in which a second conductive type impurity is introduced into a surface layer portion of the principal surface (25) at intervals from the well region (7) in the outer region (5), thereby forming second conductive type field limit regions (13A to 13C).

[Appendix 15] The method for manufacturing the semiconductor device (1, 51, 61, 71) according to Appendix 14, where the step of forming the field limit regions (13A to 13C) is executed at the same time with the step of forming the well region (7).

[Appendix 16] The method for manufacturing the semiconductor device (1, 51, 61, 71) according to Appendix 14 or 15, where an impurity concentration of the field limit regions (13A to 13C) is higher than an impurity concentration of the impurity region (6).

[Appendix 17] The method for manufacturing the semiconductor device (1, 51, 61, 71) according to any one of Appendices 14 to 16, where the impurity concentration of the field limit regions (13A to 13C) is higher than an impurity concentration of the second concentration portion (9).

[Appendix 18] The method for manufacturing the semiconductor device (1, 51, 61, 71) according to any one of Appendices 14 to 17, where the impurity concentration of the field limit regions (13A to 13C) is higher than the impurity concentration of the second concentration portion (9) over an entire region in a thickness direction of the field limit regions (13A to 13C).

[Appendix 19] The method for manufacturing the semiconductor device (1, 51, 61, 71) according to any one of Appendices 14 to 18, where the field limit regions (13A to 13C) have a thickness exceeding a thickness of the impurity region (6).

[Appendix 20] The method for manufacturing the semiconductor device (1, 51, 61, 71) according to any one of Appendices 14 to 19, where the field limit regions (13A to 13C) have a thickness exceeding a thickness of the second concentration portion (9).

In addition, various modifications can be made in the scope of matters described in the scope of claims of the present invention.

REFERENCE SIGNS LIST 1 semiconductor device
3 semiconductor layer
4 active region
5 outer region
6 impurity region
7 well region
7a bottom portion of well region
8 high concentration portion
8a bottom portion of high concentration portion
9 low concentration portion
9a bottom portion of low concentration portion
12 principal surface insulating film
13A FL region (field limit region)
13B FL region (field limit region)

13C FL region (field limit region)
21 first principal surface
25 principal surface electrode
36a lead-out portion
51 semiconductor device
61 semiconductor device
71 semiconductor device
T1 first thickness of high concentration portion
T2 second thickness of low concentration portion
T3 third thickness of FL region
W1 first width
W2 second width

The invention claimed is:

1. A semiconductor device comprising:
a first conductive type semiconductor layer which has a principal surface;
a second conductive type well region which demarcates an active region and an outer region on the principal surface and is formed in a surface layer portion of the principal surface and includes a first concentration portion high in impurity concentration on the active region side and includes a second concentration portion lower in impurity concentration than the first concentration portion on the outer region side;
a second conductive type impurity region of the active region which is formed on a surface layer portion of the principal surface; and
a principal surface electrode directly connected to the second concentration portion, with neither the first concentration portion nor the impurity region interposed in between, wherein
the well region demarcates the active region in an internal portion of the semiconductor layer and demarcates the outer region in a peripheral edge portion of the semiconductor layer in plan view and is also formed in an annular shape which surrounds the internal portion of the semiconductor layer,
the first concentration portion is formed in an annular shape which surrounds the internal portion of the semiconductor layer in plan view, and
the second concentration portion is formed in an annular shape which surrounds the first concentration portion in plan view.

2. The semiconductor device according to claim 1, wherein the second concentration portion has a concentration gradient in which an impurity concentration is gradually decreased from the principal surface toward a thickness direction.

3. The semiconductor device according to claim 1, wherein the first concentration portion has a concentration gradient in which an impurity concentration is gradually decreased from the principal surface toward a thickness direction.

4. The semiconductor device according to claim 1, wherein the second concentration portion has a thickness less than a thickness of the first concentration portion.

5. The semiconductor device according to claim 1, wherein a bottom portion of the well region is recessed from a bottom portion of the first concentration portion to a bottom portion of the second concentration portion.

6. The semiconductor device according to claim 1, wherein an impurity concentration of the impurity region is lower than an impurity concentration of the first concentration portion.

7. The semiconductor device according to claim 1, wherein the impurity region is connected to the first concentration portion.

8. The semiconductor device according to claim 1, wherein the principal surface electrode is connected to the impurity region on the principal surface.

9. The semiconductor device according to claim 8, wherein the principal surface electrode is connected to the first concentration portion.

10. The semiconductor device according to claim 1, wherein the first concentration portion has a first thickness T1 and a first width W1 and has a horizontally long structure in which W1/T1, a ratio of the first width W1 in relation to the first thickness T1 exceeds 1 in sectional view, and
the second concentration portion has a second thickness T2 and a second width W2 and has a horizontally long structure in which W2/T2, a ratio of the second width W2 in relation to the second thickness T2 exceeds 1 in sectional view.

11. The semiconductor device according to claim 1 further comprising:
a second conductive type field limit region which is formed on a surface layer portion of the principal surface at intervals from the well region in the outer region.

12. The semiconductor device according to claim 11, wherein an impurity concentration of the field limit region is higher than an impurity concentration of the impurity region.

13. The semiconductor device according to claim 11, wherein an impurity concentration of the field limit region is higher than an impurity concentration of the second concentration portion.

14. The semiconductor device according to claim 11, wherein an impurity concentration of the field limit region is higher than an impurity concentration of the second concentration portion over an entire region of the field limit region in a thickness direction.

15. The semiconductor device according to claim 11, wherein the field limit region has a thickness exceeding a thickness of the impurity region.

16. The semiconductor device according to claim 11, wherein the field limit region has a thickness exceeding a thickness of the second concentration portion.

17. The semiconductor device according to claim 9, wherein the principal surface electrode is led out onto the well region from above the impurity region and directly connected to each of the impurity region, the first concentration portion and the second concentration portion.

* * * * *